United States Patent
Chan et al.

(10) Patent No.: US 7,358,764 B1
(45) Date of Patent: Apr. 15, 2008

(54) PRESET AND RESET CIRCUITRY FOR PROGRAMMABLE LOGIC DEVICE MEMORY ELEMENTS

(75) Inventors: Mark T. Chan, San Jose, CA (US); Lin-Shih Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 56 days.

(21) Appl. No.: 11/449,944

(22) Filed: Jun. 9, 2006

(51) Int. Cl.
*G11C 5/14* (2006.01)
(52) U.S. Cl. .......................................... 326/38; 365/226
(58) Field of Classification Search ............ 326/37–41, 326/47, 101
See application file for complete search history.

(56) References Cited

U.S. PATENT DOCUMENTS

| | | | |
|---|---|---|---|
| 5,487,037 A | 1/1996 | Lee | |
| 5,581,505 A | 12/1996 | Lee | |
| 6,144,611 A | 11/2000 | Tarbouriech | |
| 6,937,063 B1 | 8/2005 | Sun et al. | |
| 7,023,744 B1 | 4/2006 | Shimanek et al. | |
| 7,109,748 B1* | 9/2006 | Liu et al. | 326/38 |
| 2004/0252573 A1* | 12/2004 | Hanson et al. | 365/229 |
| 2005/0237840 A1* | 10/2005 | Diorio et al. | 365/225.7 |
| 2007/0036018 A1* | 2/2007 | Iwata | 365/226 |
| 2007/0109017 A1* | 5/2007 | Liu et al. | 326/41 |
| 2007/0113106 A1* | 5/2007 | Liu et al. | 713/300 |

OTHER PUBLICATIONS

U.S. Appl. No. 11/282,437, filed Nov. 17, 2005, Liu et al.

* cited by examiner

*Primary Examiner*—Rexford Barnie
*Assistant Examiner*—Thienvu Tran
(74) *Attorney, Agent, or Firm*—G. Victor Treyz

(57) ABSTRACT

Integrated circuits such as programmable logic device integrated circuits have arrays of memory elements into which configuration data is loaded. The memory elements are formed form a pair of independently-powered cross-coupled inverters. Control circuitry generates a first inverter power supply signal and a second inverter power supply signal. The first and second inverter power supply signals are distributed to the inverters in the memory elements using pairs of inverter power distribution paths. When it is desired to reset the memory elements, the control circuitry takes the second power supply signal high before the first power supply signal. When it is desired to preset the memory elements, the control circuitry takes the second power supply high after the first power supply signal.

20 Claims, 21 Drawing Sheets

PRESET AND RESET CIRCUITRY FOR PROGRAMMABLE LOGIC DEVICE MEMORY ELEMENTS

BACKGROUND

This invention relates to volatile memory elements, and more particularly, to presetting and resetting volatile memory elements on integrated circuits such as programmable logic device integrated circuits.

Integrated circuits often contain volatile memory elements. Typical volatile memory elements are based on cross-coupled inverters (latches) and are used to store data. Each memory element can store a single bit of data.

Volatile memory elements are often used to store configuration data in programmable logic devices. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit from the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can drastically reduce the amount of effort required to implement a desired integrated circuit design.

Programmable logic device memory elements are organized in arrays. An array typically contains a number of banks of memory elements. The memory element array can be reset (cleared) by loading logic zeros into the banks. Reset operations are generally performed using clear transistors. With conventional programmable logic device memory arrays, each memory element has an associated clear transistor. When it is desired to reset the memory elements in the array on power-up or before loading configuration data, the clear transistors are turned on and zeros are loaded into the memory elements.

The clear transistors in conventional memory elements consume valuable circuit real estate. Moreover, memory element architectures using clear transistors are susceptible to surge currents during reset operations.

It would therefore be desirable to provide ways to perform operations such as programmable logic device memory element reset operations without consuming excessive circuit real estate or producing surge currents.

SUMMARY

In accordance with the present invention, integrated circuits such as programmable logic device integrated circuits are provided that contain memory elements. The memory elements may be loaded with configuration data. Once loaded, each memory element provides a static output signal that controls an associated logic component such as an n-channel metal-oxide-semiconductor transistor.

The memory elements are formed from independently-powered first and second cross-coupled inverters. Control circuitry is used to power the inverters in a desired order. If the first inverter of a memory element is powered before powering the second inverter, the memory element will be preset (i.e., a logic one will be loaded into the memory element). If the first inverter of a memory element is powered after powering the second inverter, the memory element will be reset (i.e., a logic zero will be loaded into the memory element).

Pairs of inverter power supply distribution paths are used to apply the inverter power supply signals to the first and second inverters in each memory element. With one suitable arrangement, each pair of inverter power supply distribution paths is associated with a column of a memory array, so that the elements in that column can be preset or reset as a group. The pairs of paths may be organized in banks, so that many columns may be reset or preset at the same time.

A shift register may be used to selectively reset or preset banks of memory elements. Multiplexer circuitry controlled by control circuitry may be used to select whether the shift register resets or presets the memory element banks.

Power down circuitry may be used to selectively deactivate one or more banks of memory elements to reduce power consumption. The power down circuitry may contain a shift register that is loaded with a pattern of ones and zeros during power-up operations.

Further features of the invention, its nature and various advantages will be more apparent from the accompanying drawings and the following detailed description of the preferred embodiments.

DETAILED DESCRIPTION

The present invention relates to integrated circuits containing memory elements. The integrated circuits may be memory chips, digital signal processing circuits with memory arrays, microprocessors, application specific integrated circuits with memory arrays, programmable circuits in which memory elements are used for configuration memory such as programmable logic device integrated circuits and other programmable integrated circuits, or any other suitable integrated circuit. The present invention will generally be described in the context of programmable logic device integrated circuits and programmable logic device memory elements as an example.

Figure 1:
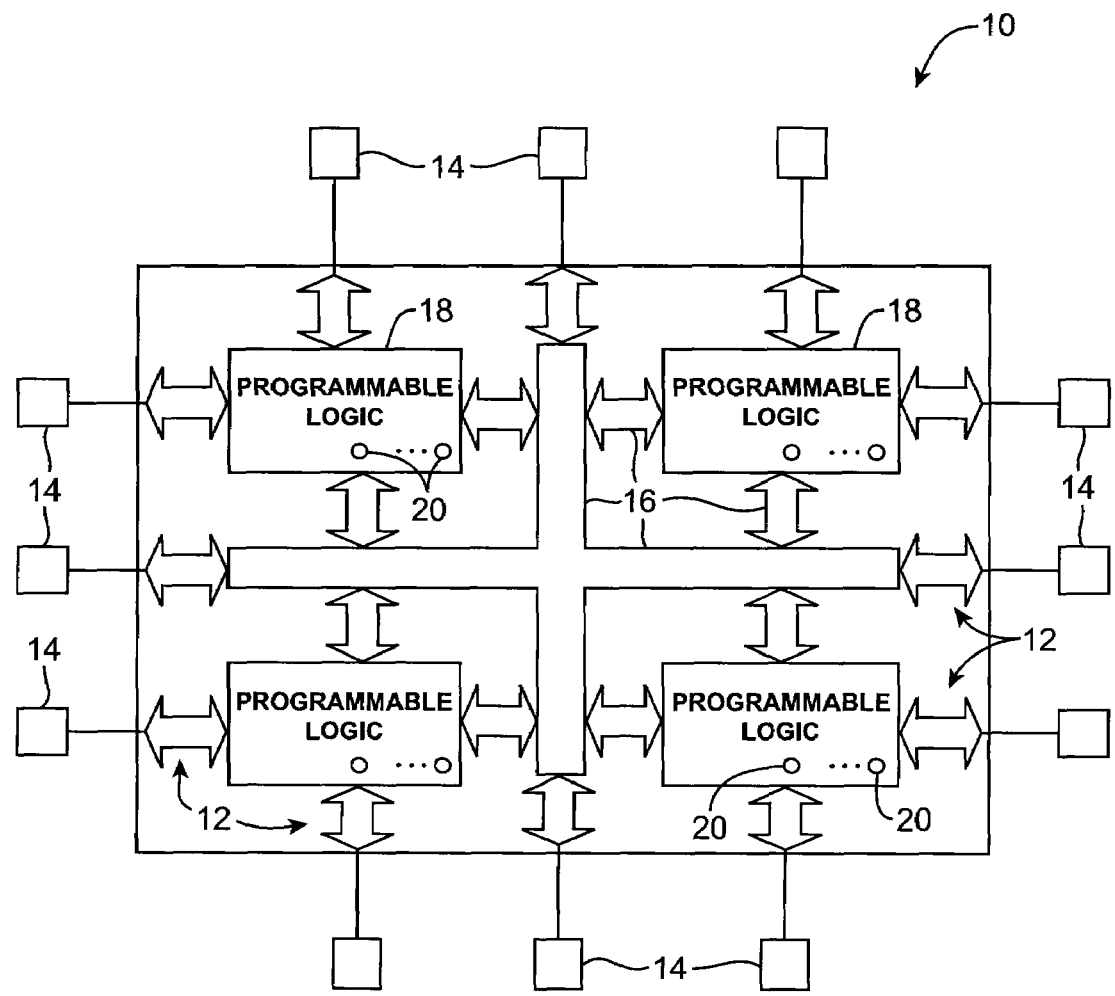
FIG. 1 is a diagram of an illustrative programmable logic device integrated circuit in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) power-down transistors.

When a memory element supplies a high output to a NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The memory elements 20 are generally arranged in an array pattern. In a typical modern programmable logic device, there may be millions of memory elements 20 on each chip.

Figure 2:
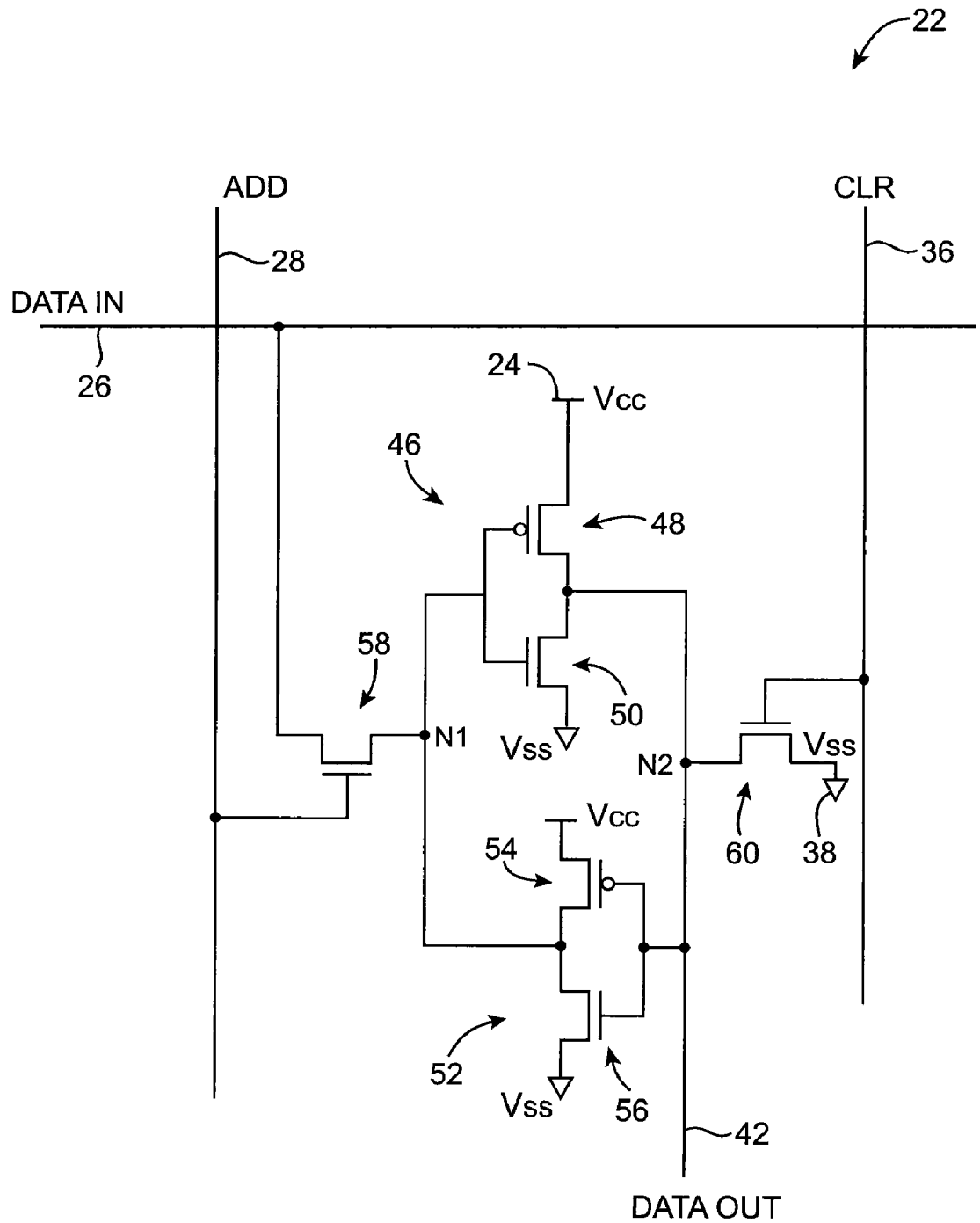
FIG. 2 is a diagram of a conventional programmable logic device integrated circuit configuration random-access-memory (CRAM) memory element.

When memory elements are arranged in an array, horizontal and vertical conductors and associated loading circuitry may be used to load the memory elements with configuration data. A conventional memory element 22 of the type used in conventional programmable logic devices is shown in FIG. 2. Memory element 22 is powered using a positive power supply voltage Vcc and a ground power supply voltage Vss. The voltage Vcc is typically 1.2 volts and the voltage Vss is typically 0 volts. These are the same voltage levels that are used to power the programmable logic in the core of the conventional programmable logic device in which an array of memory elements 22 is being used.

The memory element 22 is formed from two cross-coupled inverters—inverter 46 and inverter 52. Inverter 46 has a p-channel metal-oxide-semiconductor (PMOS) transistor 48 and an n-channel metal-oxide-semiconductor (NMOS) transistor 50. Inverter 52 has PMOS transistor 54 and NMOS transistor 56. The NMOS clear transistor 60 is turned on during reset operations by activating clear line 36. This connects node N2 to ground 38 and clears the memory element 22. The output of the memory element on line 42 (DATAOUT) is determined by the signal on node N2. Address transistor 58 is controlled by the address signal ADD on line 28. Configuration data is loaded into cell 22 via line 26.

Figure 3:
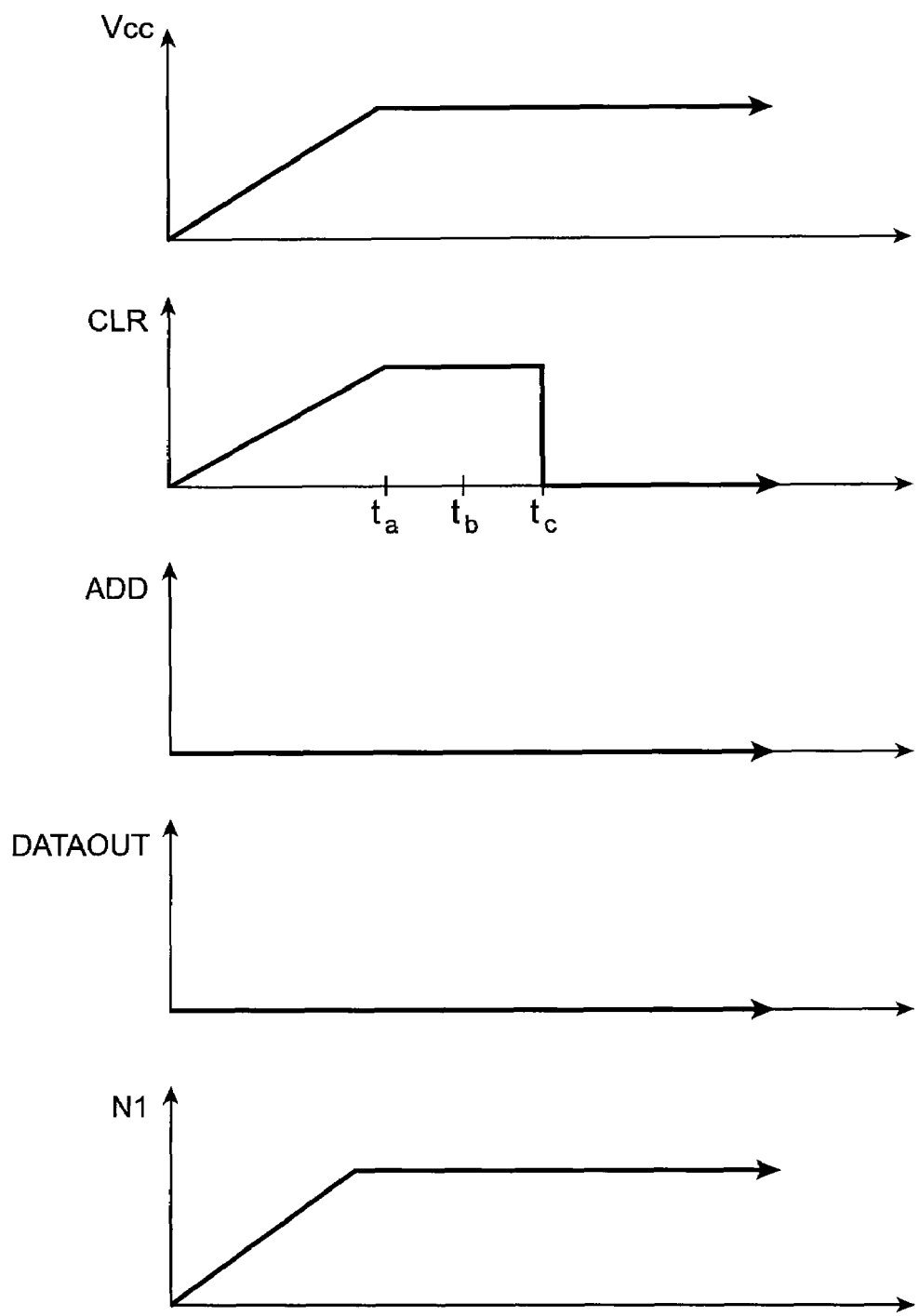
FIG. 3 is a diagram showing signals involved in resetting a conventional configuration random-access-memory (CRAM) memory element during power-up operations on a programmable logic device integrated circuit in accordance with the present invention.

Conventional memory elements such as memory element 22 of FIG. 2 are typically reset as the programmable logic device in which they are operating is powered up. Signal traces illustrating power-up reset operations are shown in FIG. 3. As shown in the upper trace of FIG. 3, the positive power supply signal Vcc is gradually ramped to its full value during power up. Address signal ADD is held low, as shown in the third trace of FIG. 3, so transistor 58 does not turn on. As the programmable logic device is powered, the reset signal CLR ramps up to a logic one value and is fully powered by time $t_a$, as shown by the second trace of FIG. 3. This turns on transistor 60 and connects node N2 (signal DATAOUT) to ground. With node N2 low, inverter 52 drives a one onto node N1, so N1 is high, as shown in the fifth trace of FIG. 3. At time $t_b$, node N1 is high and DATAOUT is low, so the memory element 22 has been loaded with a logic zero (i.e., memory element 22 has been reset). As shown in the second trace of FIG. 3, the value of CLR can be taken low at time $t_c$, so that memory elements such as memory element 22 can be loaded with configuration data.

Figure 4:
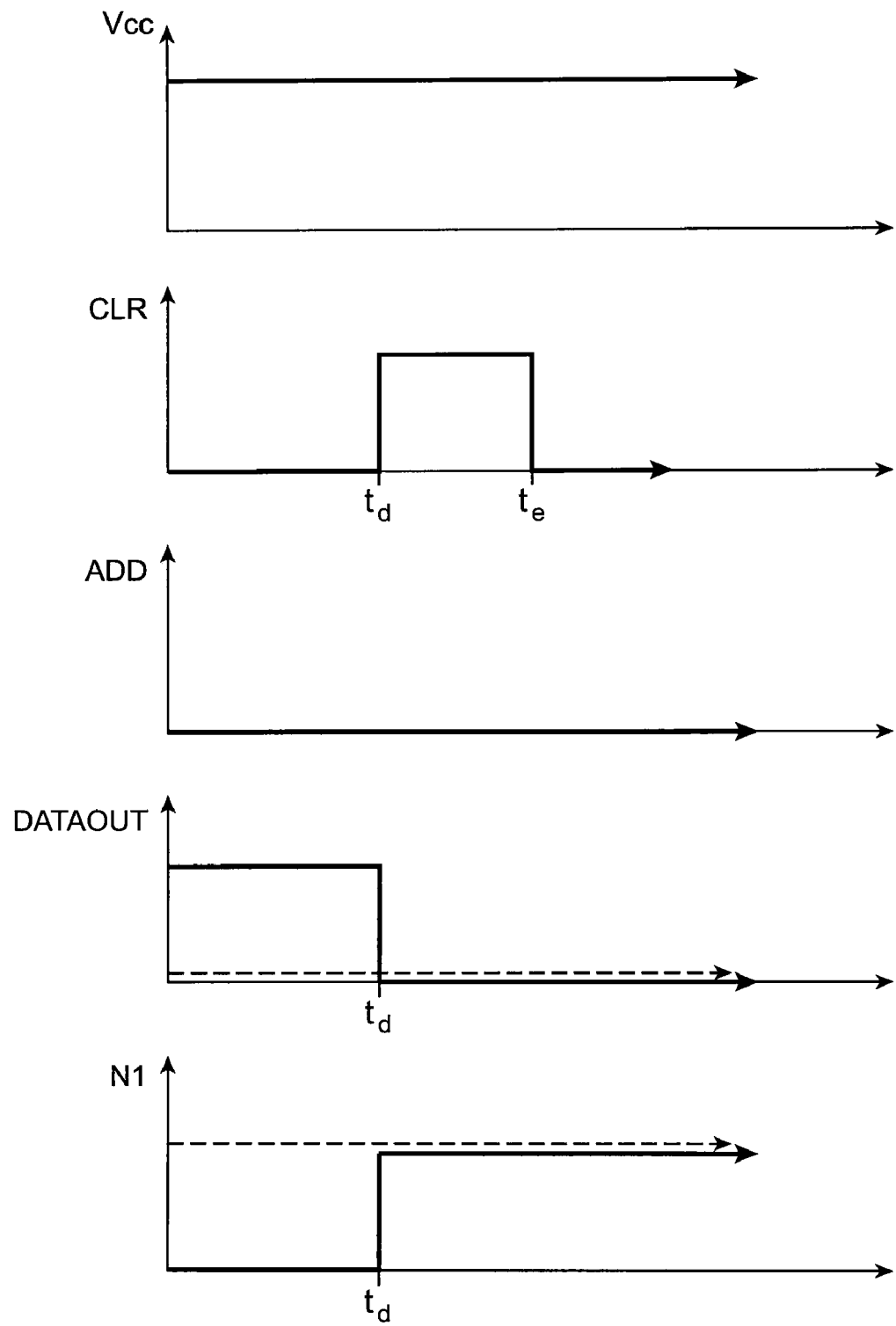
FIG. 4 is a diagram showing signals involved in resetting a conventional configuration random-access-memory (CRAM) memory element during post-power-up clear operations on a programmable logic device integrated circuit in accordance with the present invention.

Conventional memory elements such as memory element 22 can also be reset after power-up operations are complete (i.e., in preparation for programming). Signal traces illustrating post-power-up reset operations are shown in FIG. 4. As shown in the upper trace of FIG. 4, the positive power supply signal Vcc has fully ramped up and is being used to power the programmable logic device. Address signal ADD is held low, as shown in the third trace of FIG. 4. Because ADD is low, transistor 58 is off. As shown in the second trace, at times before $t_d$, the reset signal CLR is low. As shown in the fourth and fifth traces of FIG. 4, at times before time $t_d$, data signal DATAOUT (the signal on node N2) can have either a high or low value, whereas the signal on node N1 can have either a low or high value. In the situation depicted by the solid lines in the fourth and fifth traces, DATAOUT is high and N1 is low. In the situation depicted by the dotted lines in the fourth and fifth traces, DATAOUT is low and N1 is high.

At time $t_d$, the signal CLR is asserted, which turns on transistor 60. The response of memory element 22 to the assertion of the CLR signal depends on whether the memory element 22 is storing a zero or a one.

In the situation depicted by the solid lines, element 22 contains a one and the value of DATAOUT (node N2) is pulled low at time $t_d$. Inverter 52 inverts the low value of DATAOUT, so the signal on node N1 rises.

In the situation depicted by the dotted lines in FIG. 4, element 22 contains a zero and the value of DATAOUT (node N2) remains low at time $t_d$. Inverter 52 inverts the low value of DATAOUT, so the signal on node N1 remains high at time $t_d$.

Following time $t_d$, the memory element 22 has been reset and contains a logic zero. At time $t_e$, the reset signal CLR is deasserted, so that memory elements such as memory element 22 can be loaded with configuration data.

Configuration data may be loaded into memory elements such as memory element 22 using data lines such as data line 26 of FIG. 2. When address line 28 is taken high, NMOS transistor 58 is turned on and the signal on data line 26 is driven into the memory element 22. If the signal on line 26 is high, node N1 remains high and the memory element 24 remains in its low (reset) state. In this situation, the memory element 22 contains a zero and the output DATAOUT is low. If the signal on line 26 is low, node N1 is taken low and, due to the inversion of the low N1 signal by inverter 46, the voltage on node N2 is taken high. This makes the output DATAOUT high (i.e., the memory element 22 contains a logic one).

Following the loading of a one or zero configuration data bit into the memory element 22, the signal DATAOUT is applied to the gate of an associated metal-oxide-semiconductor transistor. This turns the transistor on or off and configures the logic in which the transistor is being used.

With the conventional memory element arrangement of FIG. 2, a clear transistor 60 is required for each memory element 22. This consumes real estate on the programmable logic device that might otherwise be used to implement a user's custom logic function.

Moreover, memory elements of this type are susceptible to surge currents during reset operations. Consider a memory element 22 that is storing a logic one. In this memory element, the voltage on node N1 is low and the voltage on node N2 is high. When the reset control line 36 is taken high to reset memory element 22, transistor 60 is turned on. When transistor 68 is turned on, node N2 is connected through a low-resistance path to ground power supply signal Vss at terminal 38. This pulls node N2 to ground. Inverter 52 begins to invert the low voltage on node N2 to create a high voltage on node N1. However, before the low signal on node N2 is inverted by inverter 52, node N1 is still low and transistor 48 is on. As a result, there is a low-resistance path from positive power supply terminal 24 to ground terminal 38 through transistor 48 and newly-turned-on transistor 60. A so-called surge current flows through this low-resistance path. Surge currents of this type are undesirable, because they can disrupt proper operation of an integrated circuit's power supply, particularly during power-up operations.

In accordance with the present invention, integrated circuits are provided having memory elements in which preset transistors such as the conventional preset transistor 60 of FIG. 2 are not needed. This approach helps to minimize circuit real estate for the memory element array and avoids surge current issues.

Figure 5:
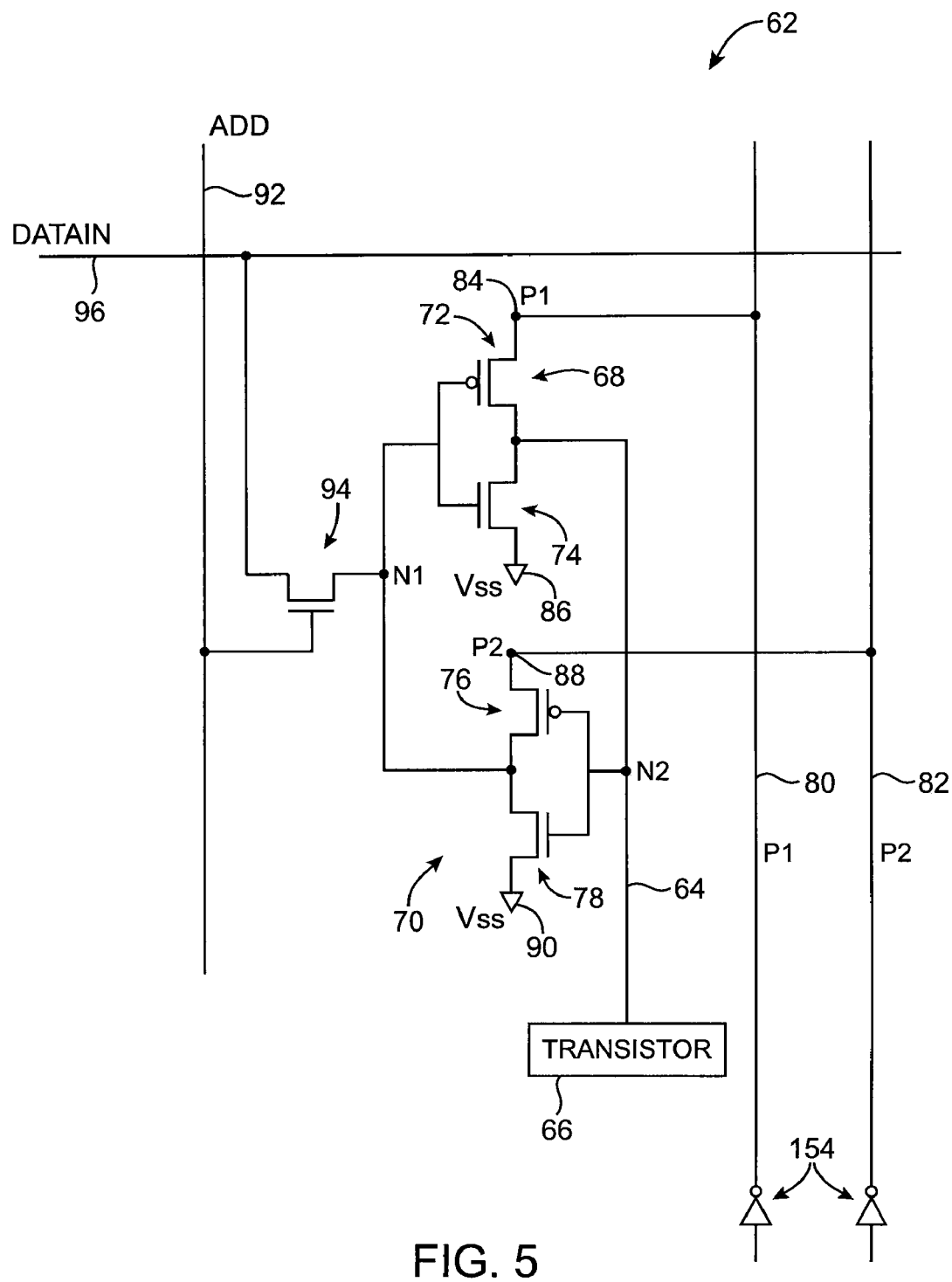
FIG. 5 is a diagram of a programmable logic device integrated circuit memory element in accordance with the present invention.

A memory element 62 that may be used in an array of memory elements (e.g., in a configuration random-access-memory array) in a programmable logic device 10 in accordance with the present invention is shown in FIG. 5. Memory element 62 provides an output signal DATAOUT on output 64 that controls a programmable logic transistor 66.

Memory element 62 is formed from two cross-coupled inverters—inverter 68 and inverter 70. Inverter 68 has a p-channel metal-oxide-semiconductor (PMOS) transistor 72 and an n-channel metal-oxide-semiconductor (NMOS) transistor 74. Inverter 70 has PMOS transistor 76 and NMOS transistor 78.

Preset operations in which a logic one is loaded into memory element 62 and reset operations in which a logic zero is loaded into memory element 62 are performed by supplying appropriate power supply voltages P1 and P2 on inverter power supply lines 80 and 82, respectively. The power supply voltage P1 serves as the positive power supply voltage for inverter 68 and is applied to positive power supply terminal 84. The power supply voltage P2 serves as the positive power supply voltage for inverter 70 and is applied to positive power supply terminal 88. Ground voltage Vss is applied to inverters 68 and 70 using ground power supply terminals 86 and 90.

When address line 92 (signal ADD) is taken high, NMOS address transistor 94 is turned on and the signal on data line 96 is driven into the memory element 62. If the memory element 62 has been reset and the signal on line 96 is high, node N1 remains high when ADD is asserted and the memory element 62 remains in its reset (cleared) state. In this situation, the voltage on node N2 is low and the output DATAOUT is low on line 64. If the memory element 62 has been reset and the signal on line 96 is low when ADD is asserted, node N1 is taken low. Inverter 68 inverts the low voltage on node N1, so that the voltage on node N2 and the signal DATAOUT on line 64 are taken high. The DATAOUT signal is applied to the gate of transistor 66 or other suitable controllable logic component in programmable logic 18 (FIG. 1).

The power supply signals P1 and P2 are not fixed and vary as a function of time. Reset and preset operations are performed by controlling the order in which the inverters 68 and 70 are powered using power supply signals P1 and P2.

Figure 6:
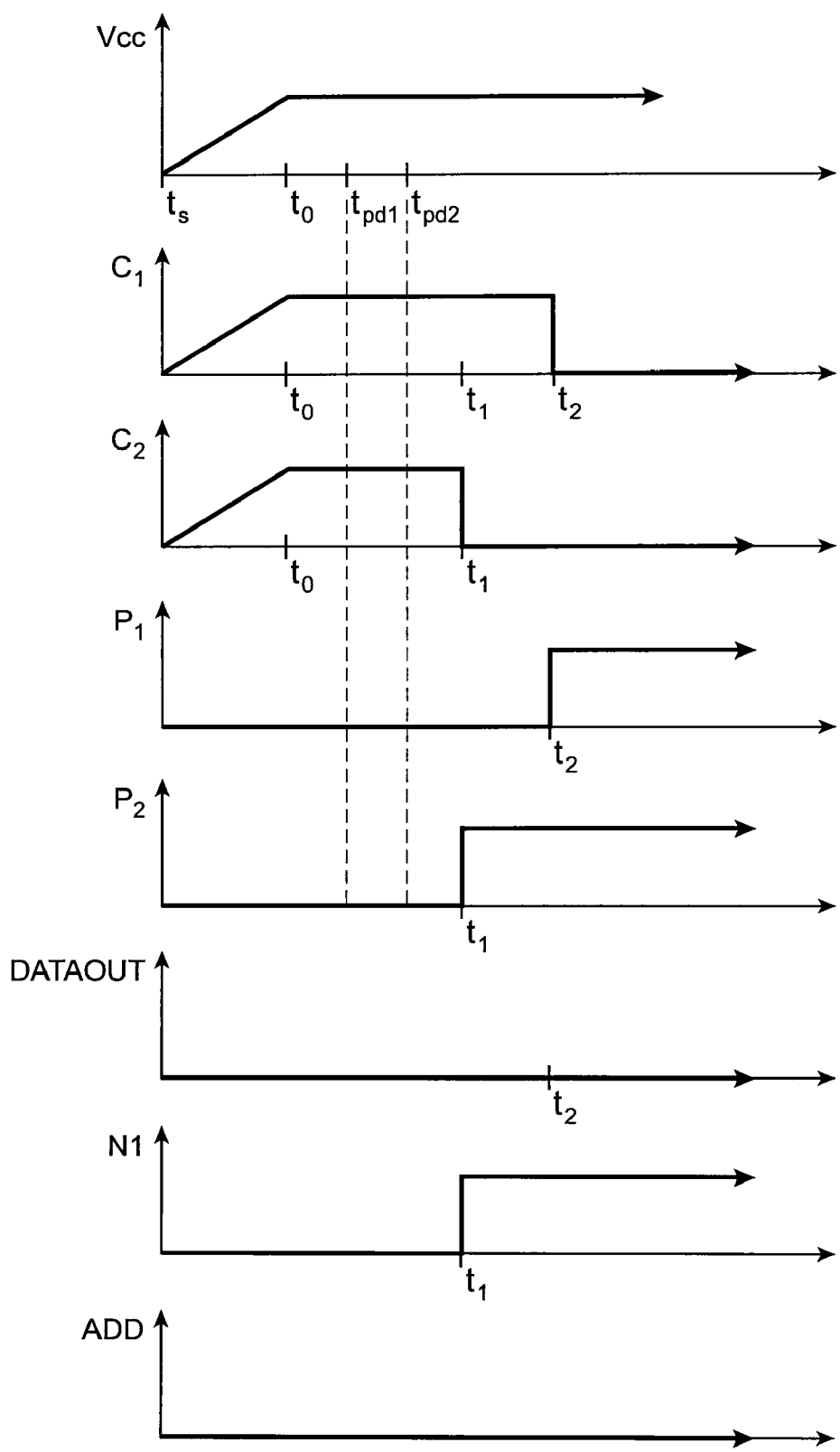
FIG. 6 is a diagram showing signals involved in resetting a programmable logic device integrated circuit memory element during power-up operations in accordance with the present invention.

Signal traces illustrating the way in which a memory array of memory elements 62 can be reset when powering up programmable logic device integrated circuit 10 are shown in FIG. 6. As shown in the first trace of FIG. 6, the positive power supply voltage Vcc for the programmable logic device 10 is ramped up between time $t_s$ and time $t_0$. With one suitable arrangement, the value of Vcc is about 1.1 volts and is used to power components in programmable logic 18 (sometimes called core logic). The use of a Vcc voltage of 1.1 volts is merely illustrative. Any suitable voltage Vcc may be used to power device 10 if desired. The ground power supply voltage Vss is typically 0 volts. If desired, however, Vss can have a positive or negative voltage. The use of a ground power supply voltage Vss of 0 volts is described as an example.

Signals C1 and C2, which are shown in the second and third traces of FIG. 6, are generated using control circuitry. By time $t_0$, signals C1 and C2 have been fully powered and have risen to the level of Vcc (e.g., 1.1 volts or another suitable voltage). After times to, a pair of inverters is used to invert the signals C1 and C2 to produce inverter power supply signals P1 and P2, as shown in the fourth and fifth traces of FIG. 6. With one suitable arrangement, the low values of signals C1, C2, P1, and P2 are Vss and the high values of signals C1, C2, P1, and P2 are Vcc.

Power supply signal P2 is used to power inverter 70 of FIG. 5. Power supply signal P1 is used to power inverter 68 of FIG. 5. At time $t_0$, C1 and C2 have been fully powered and are high. The inverted power supply signals P1 and P2 are therefore low. With P1 and P2 low at time $t_0$, the inverters 68 and 70 are both off. The signal on node N1 and the signal DATAOUT at node N2 are therefore both low at time to, as shown in the sixth and seventh traces of FIG. 6.

The signal ADD is not asserted during the power-up reset operations of FIG. 6, as shown in the eighth trace of FIG. 6.

A time $t_1$, the signal C2 is taken low. The inverter power supply signal P2, which is produced by inverting C2 therefore goes high at time $t_1$. With inverter power supply signal P2 high, inverter 70 is turned on. Inverter 70 inverts the low signal on node N2 (DATAOUT) and produces a high output. As shown in the seventh trace of FIG. 6, this drives the signal N1 high at time $t_1$.

At time $t_2$, the signal C1 is taken low. The inverter power supply signal P1 is produced by inverting signal C1, so P1 goes high at time $t_2$. With power supply signal P1 high, inverter 68 is turned on. The high voltage N1 is supplied to the input of inverter 68. At time $t_2$, when inverter 68 is turned on, inverter 68 inverts its high input voltage to produce a low output voltage. The low output of inverter 68 drives a low voltage onto node N2. The voltage on node N2 and the DATAOUT signal just prior to time $t_2$ were already low, so the value of the DATAOUT signal at time $t_2$ does not change. At times after time $t_2$, the DATAOUT signal is low, indicating that the memory element 62 has been successfully reset.

If desired, memory element 62 can be reset at times after the programmable logic device integrated circuit 10 has been powered up. For example, the array of memory elements on a programmable logic device integrated circuit can be reset prior to loading some or all of the memory elements with configuration data during device programming.

Figure 7:
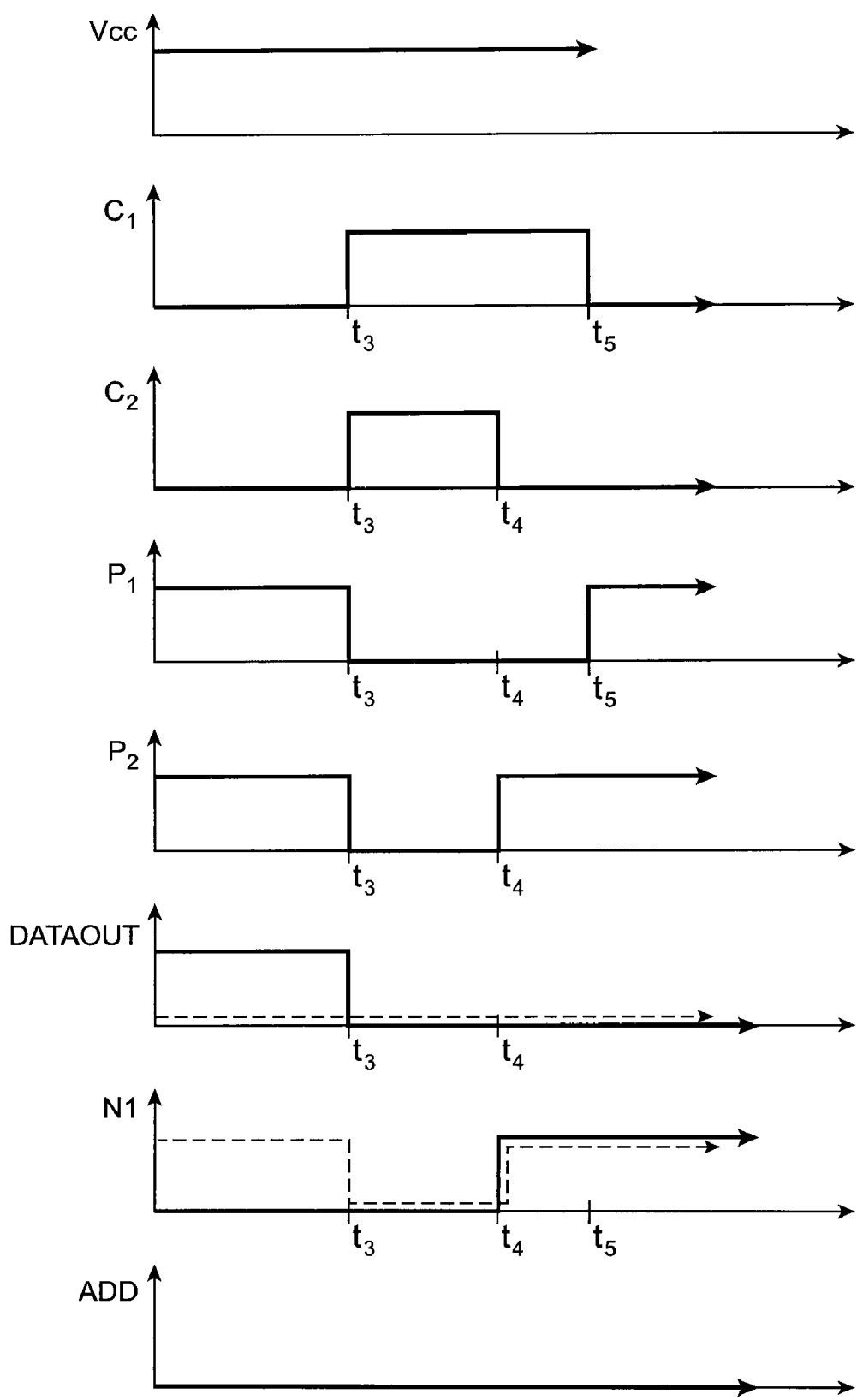
FIG. 7 is a diagram showing signals involved in resetting a programmable logic device integrated circuit memory element during post-power-up operations in accordance with the present invention.

Signal traces illustrating the way in which a memory array of memory elements 62 can be reset in a programmable logic device integrated circuit 10 that has already been powered up are shown in FIG. 7. As shown in the first trace of FIG. 7, the positive power supply voltage Vcc for the programmable logic device 10 has already been ramped up and is being maintained high (e.g., at 1.1 volts). Ground power supply signal Vss is low.

Signals C1 and C2, which are shown in the second and third traces of FIG. 7, are generated using control circuitry. At times before time $t_3$, signals C1 and C2 are low. Inverters are used to invert signals C1 and C2 to produce inverter power supply signals P1 and P2, as shown in the fourth and fifth traces of FIG. 7. Because C1 and C2 are low before time $t_3$, P1 and P2 are high before time $t_3$. Power supply signal P2 is used to power inverter 70 of FIG. 5. Power supply signal P1 is used to power inverter 68 of FIG. 5. Before time $t_3$, memory element inverters 68 and 70 are both on.

At time $t_3$, C1 and C2 are taken high. The inverted power supply signals P1 and P2 are therefore taken low at time $t_3$. With P1 and P2 low at time $t_3$, the inverters 68 and 70 are both turned off.

The signal DATAOUT prior to time $t_3$ may have been high (solid line) or low (dotted line). The signal N1 is the inverse of signal DATAOUT prior to time $t_3$, so N1 may have been low (solid line) or high (dotted line) prior to time $t_3$.

If DATAOUT was high and N1 was low prior to time $t_3$, turning off inverter 68 at time $t_3$ causes DATAOUT to go low. The signal N1 in this situation was already low, so N1 remains low at time $t_3$. If DATAOUT was low and N1 was high prior to time $t_3$, turning off inverter 70 at time $t_3$ causes N1 to go low. Because DATAOUT was already low, DATAOUT remains low at time $t_3$.

At time $t_4$, the signal C2 is taken low. This takes signal P2 high and powers inverter 70. With node N2 (the DATAOUT signal) low, powering inverter 70 drives a high signal onto node N1. As a result, the voltage on node N1 goes high at time $t_4$. Inverter 68 inverts the high signal N1 and drives a corresponding low signal onto node N2. The signal DATAOUT was already low, so DATAOUT remains unchanged at time $t_4$.

At time $t_5$, the signal C1 is taken low. As a result, inverter power supply signal P1 goes high at time $t_5$. Taking P1 high turns on inverter 68. At time $t_5$, the voltage on node N1 is high. With inverter 68 turned on, inverter 68 inverts the high N1 signal and drives a low voltage onto node N2. The signal DATAOUT therefore remains low at times after $t_5$, indicating that the memory element 62 has been successfully reset.

Figure 8:
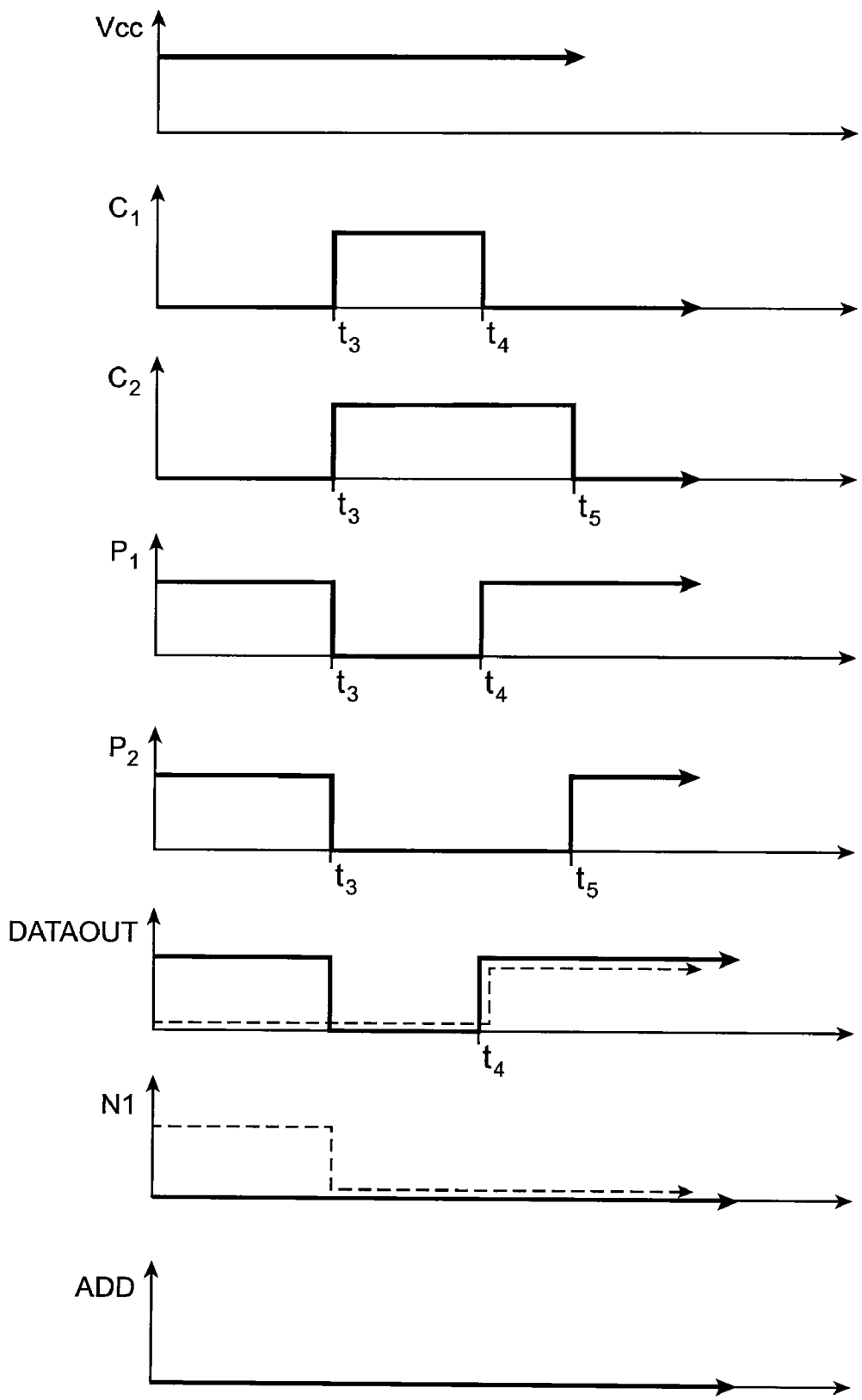
FIG. 8 is a diagram showing signals involved in presetting a programmable logic device integrated circuit memory element following power-up operations in accordance with the present invention.

If desired, memory element 62 can be preset. Preset operations involve loading a one into the memory element. Signal traces illustrating how a memory array of memory elements 62 can be preset in a programmable logic device integrated circuit 10 that has already been powered up are shown in FIG. 8. As shown in the first trace of FIG. 8, the positive power supply voltage Vcc for the programmable logic device 10 has already been ramped up and is being maintained high (e.g., at 1.1 volts). Ground power supply signal Vss is low.

Signals C1 and C2, which are shown in the second and third traces of FIG. 8, are generated using control circuitry. At times before time $t_3$, signals C1 and C2 are low. Inverters are used to invert signals C1 and C2 to produce inverter power supply signals P1 and P2, as shown in the fourth and fifth traces of FIG. 8. Because C1 and C2 are low before time $t_3$, P1 and P2 are high before time $t_3$ and memory element inverters 68 and 70 are both on.

At time $t_3$, C1 and C2 are taken high. The inverted power supply signals P1 and P2 are therefore taken low at time $t_3$. With P1 and P2 low at time $t_3$, the inverters 68 and 70 are both turned off.

The signal DATAOUT prior to time $t_3$ may have been high (solid line) or low (dotted line). The signal N1 is the inverse of signal DATAOUT prior to time $t_3$, so N1 may have been low (solid line) pr high (dotted line) prior to time $t_3$.

If DATAOUT was high and N1 was low prior to time $t_3$, turning off inverter 68 at time $t_3$ causes DATAOUT to go low. The signal N1 in this situation was already low, so N1 remains low at time $t_3$. If DATAOUT was low and N1 was high prior to time $t_3$, turning off inverter 70 at time $t_3$ causes N1 to go low. Because DATAOUT was already low, DATAOUT remains low at time $t_3$.

At time $t_4$, the signal C1 is taken low. This takes signal P1 high and powers inverter 68. With node N1 low, powering inverter 68 drives a high signal onto node N2. As a result, the voltage on node N2 (signal DATAOUT) goes high at time $t_4$.

At time $t_5$, the signal C2 is taken low. As a result, inverter power supply signal P2 goes high at time $t_5$. Taking P2 high turns on inverter 70. Inverter 70 inverts the high signal DATAOUT and drives a corresponding low signal onto node N1. The signal N1 was already low prior to time $t_5$, so the N1 voltage remains unchanged at time $t_4$. At times after time $t_5$, both inverters are on, N1 is low and DATAOUT is high, indicating the memory element 62 has been successfully preset.

As the examples of FIGS. 6-8 demonstrate, if P2 is taken high before P1, memory element 62 will be reset. If P1 is taken high before P2, memory element 62 will be preset.

Figure 9:
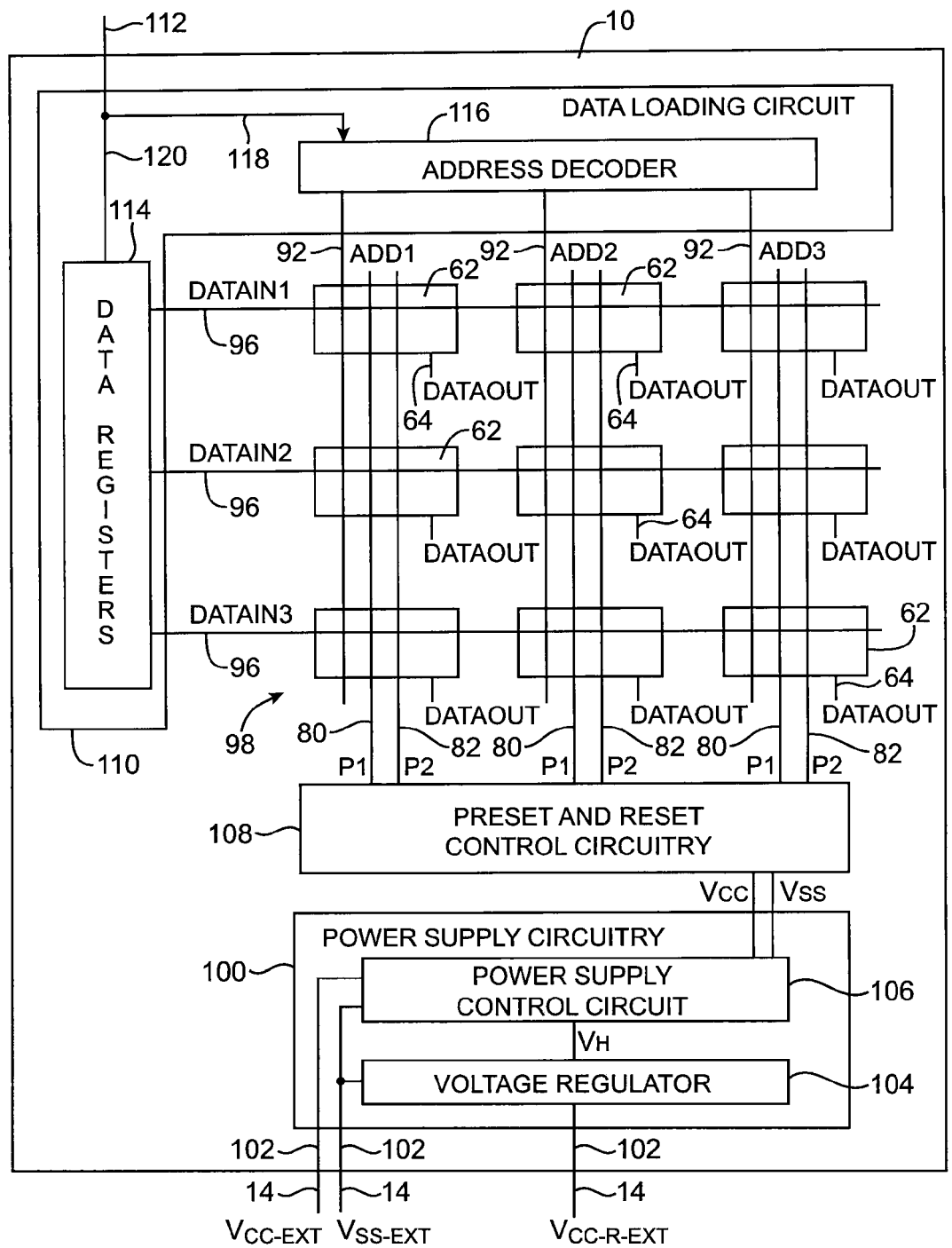
FIG. 9 is a circuit diagram of a programmable logic device integrated circuit containing a memory array and circuitry for presetting and resetting the memory array in accordance with the present invention.

A programmable logic device integrated circuit 10 with illustrative circuitry that may be used to control preset and reset operations for an array of memory elements is shown in FIG. 9. Programmable logic device 10 of FIG. 9 contains an array 98 of memory elements such as memory element 62 of FIG. 5. In device 10, memory elements 62 of FIG. 5 serve as the programmable elements 20 of FIG. 1. The array 98 that is depicted in FIG. 9 has three columns and three rows of elements 62 to avoid over-complicating the drawing. In actual programmable logic device integrated circuits 10, array 98 generally has hundreds or thousands of rows and hundreds or thousands of columns of memory elements 62.

As shown in FIG. 9, programmable logic device integrated circuit 10 has configuration random-access-memory (CRAM) power supply circuitry 100. Power supply circuitry 100 receives power through pins such as pins 14 and paths such as paths 102. With one suitable arrangement, the voltages Vss and Vcc and other suitable power supply voltages such as an elevated power supply voltage Vcc-r for operating device 10 are provided to device 10 from a board on which programmable logic device integrated circuit 10 is mounted. The external versions of these voltages are labeled as Vcc-ext, Vss-ext, and Vcc-r-ext in FIG. 9. With one suitable arrangement, Vcc-ext is 1.1 volts, Vss-ext is 0 volts, and Vcc-r-ext is 2.5 volts. These power supply voltages are typically distributed to circuitry such as programmable logic 18 and input-output circuitry 12 via power distribution paths. Paths 102 may be used to distribute the external power supply voltages to voltage regulator 104 and power supply control circuit 106.

Power supply circuitry 100 supplies power supply voltages Vcc and Vss to preset and reset control circuitry 108. Control circuitry 108 performs functions such as resetting and presetting the memory elements 62. If desired, control circuitry 108 may also perform power-down operations to power down unused portions of array 98.

Power supply signals P1 and P2 are distributed to the memory elements 62 in array 98 on inverter power supply distribution paths 80 and 82. When it is desired to reset the elements of array 98, the control circuitry 108 takes P2 high before P1, as shown in FIGS. 7 and 8. When it is desired to preset the element of array 98, the control circuitry 108 takes P1 high before P2. The time-varying inverter power supply signals P1 and P2 are produced by the control circuitry 108 using the voltages Vcc and Vss that are supplied to control circuitry 108 from power supply circuitry 100.

With one suitable arrangement, the voltages Vcc and Vss are fixed. For example, Vcc may be 1.1 volts and Vss may be 0 volts. In this type of scenario, the values of P1 and P2 may swing between 0 volts and 1.1 volts. The power supply level used to power array 98 will generally be the same as the power supply level used to power the core logic on device 10.

With another suitable arrangement, the power supply level used to power the memory elements 62 in array 98 may be elevated relative to the core logic power supply voltage. An elevated power supply level may be produced by raising Vcc and/or reducing Vss. For example, Vcc may be elevated to 1.6 volts and Vss may be maintained at 0 volts, whereas the core logic on the programmable logic device integrated circuit 10 may be powered using a 1.1 volt positive supply and a 0 volt ground. If this type of elevated power supply scheme is used, the memory elements 62 will produce DATAOUT signals that swing between 0 volts and 1.6 volts. By using an elevated power supply of 1.6 volts, logic high DATAOUT signals will be relatively large (i.e., 1.6 volts). The DATAOUT signals are applied to the gates of NMOS pass transistors in programmable logic 18. Using the relative large high DATAOUT signals will tend to turn these pass transistors on more fully than would otherwise be possible, which will improve device performance.

The type of voltages that are supplied to power supply control circuit 106 depend on the power supply scheme that is being used. In scenarios in which control circuitry 108 supplies P1 and P2 signals with relatively large values, a relatively large voltage $V_H$ is supplied to power supply control circuit 106 by voltage regulator 104. The voltage $V_H$ may be, for example, a 1.6 volt signal produced from a 2.5 volt Vcc-r-ext signal. Power supply control circuitry 106 may produce the signal Vcc using the $V_H$ signal supplied by voltage regulator 104. In scenarios in which control circuitry 108 supplies P1 and P2 signals that are not large, the power supply control circuit 106 can supply Vcc and Vss signals to control circuitry 108 that are based on Vcc-ext and Vss-ext. As an example, circuit 106 can supply voltages Vcc and Vss to control circuitry 108 at voltages of 1.1 volts and 0 volts.

Data loading circuit 110 controls data loading operations for array 98. Data loading circuit 110 receives configuration data from external sources via input path 112. In a typical system, configuration data is loaded into a programmable logic device from a memory and data loading circuit. This type of circuit, which is sometimes referred to as a configuration device, loads configuration data into registers 114.

Configuration data may be loaded into registers 114 via paths 112 and 120. Registers 114 apply the configuration data in parallel to array 98 via the DATAIN1, DATAIN2, and DATAIN3 lines 96. Address decoder 116 receives addressing information via paths 112 and 118 from an external source or from circuitry in data loading circuit 110. The address decoder 116 systematically asserts and deasserts desired address lines 92 (i.e., ADD1, ADD2, or ADD3). As the address line in each column is asserted, the data on the data lines 96 is loaded into the memory elements 62 in that column. By addressing each column in this way, the entire array 98 is loaded with configuration data. After the array has been loaded, the output 64 of each memory element 62 produces a corresponding static control signal for controlling the gate of an NMOS transistor such as an NMOS pass transistor, a PMOS transistor such as a PMOS power-down transistor, or other logic component in the core logic 18 of the programmable logic device 10.

The preset and reset control circuitry 108 may be based on any suitable architecture. With one suitable arrangement, preset and reset control circuitry 108 includes a shift register and associated multiplexers and inverters. The contents of the shift register determines which inverter power supply signals are supplied on paths 80 and 82.

Figure 10:
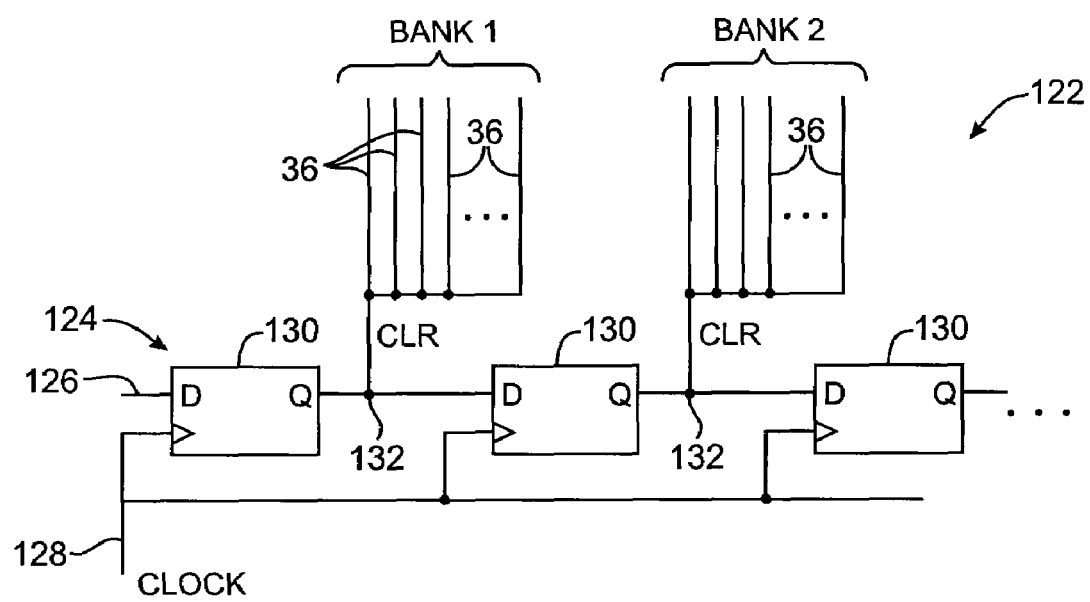
FIG. 10 is a circuit diagram of a conventional configuration random-access-memory (CRAM) array reset circuit that may be used to reset an array of configuration random-access-memory cells of the type shown in FIG. 2.

A conventional circuit 122 for resetting an array of configuration random-access-memory (CRAM) memory elements on a programmable logic device is shown in FIG. 10. Circuit 122 has a shift register 124 containing a chain of registers 130. Shift register 124 receives data at data input 126. Each register 130 receives a clock signal from a clock distribution path 128. By clocking data into input 126, all of the registers 130 in shift register 124 can be loaded with ones or zeros as desired.

The output of each register 130 is provided to a respective node 132. Each node 132 is connected to a number of clear lines 36 (also shown in FIG. 5). The clear lines 36 are grouped in banks, so that banks of memory elements can be reset in parallel. When it is desired to reset the memory elements in an array, a bit pattern containing logic zeros and a logic one is shifted through the register. Each time the logic one passes through a given register, the output of that register and its associated node 132 goes high. This makes the lines 36 in the associated bank go high. By asserting the clear lines 36 in this way, the clear transistors 60 in each memory element are turned on and the memory elements are cleared.

Figure 11:
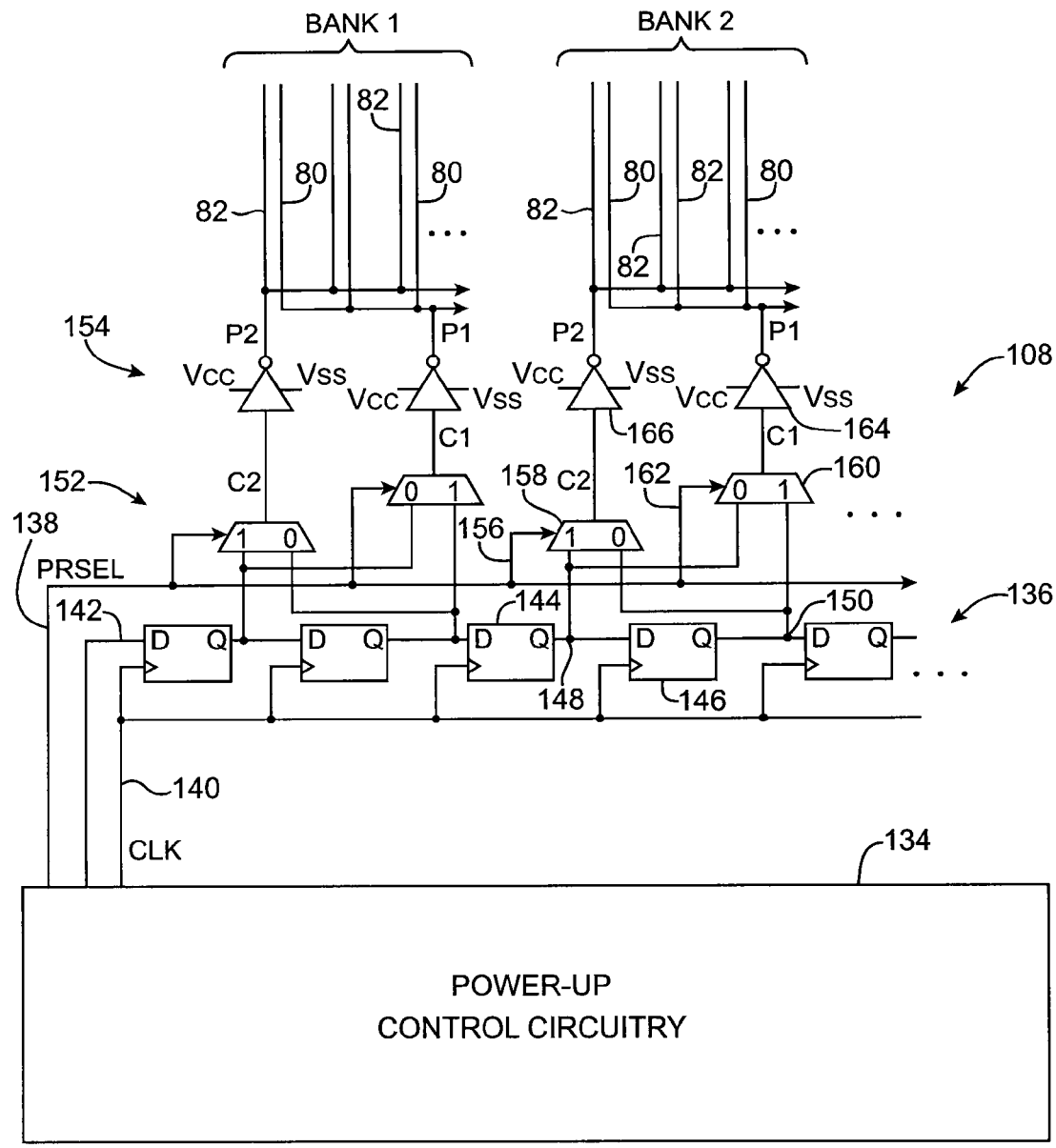
FIG. 11 is a circuit diagram of illustrative preset and reset circuitry that may be used to preset and reset memory elements of the type shown in FIG. 5 in accordance with the present invention.

Preset and reset control circuitry 108 that may be used in a programmable logic device integrated circuit 10 of the type shown in FIG. 9 is shown in FIG. 11. As shown in FIG. 11, control circuitry 108 includes power-up control circuitry 134. Control circuitry 134 generates a clock signal CLK for path 140, data for path 142, and a preset/reset control signal PRSEL for path 138.

Circuitry 108 includes a shift register 136. The registers in shift register 136 receive clock signal CLK via path 140. The input to the first register in the shift register 136 receives data from power-up control circuitry 134 via path 142.

Circuitry 108 uses multiplexers 152 to select which register output signals from shift register 136 are routed into the memory array. Each multiplexer 152 has two inputs, which are labeled "1" and "0" in FIG. 11. Each multiplexer 152 also has an output and a control input. The control inputs receive the signal PRSEL from power-up control circuitry 134. When PRSEL is a logic one, multiplexers 152 each connect their "1" input to their output. When PRSEL is a logic zero, multiplexers 152 each connect their "0" input to their output.

The outputs from multiplexers 152 are the signals C1 and C2. Signals C1 and C2 are inverted by inverters 154 to produce inverter power supply signals P1 and P2. In the illustrative circuit arrangement of FIG. 11, inverters 154 are powered by power supply voltages Vcc and Vss.

The inverter power supply signals P1 and P2 are routed to the memory elements 62 in the array 98 via paths 80 and 82. In the illustrative arrangement of FIG. 11, paths 80 and 82 are arranged in banks and are used to power the inverters 68 and 70 in banks of associated memory elements 62. In a typical scenario, each bank contains 36 columns of memory elements and 36 corresponding pairs of paths 80 and 82 and each array 98 has hundreds of banks. This is merely illustrative. In general, array 98 may be organized using any suitable number of banks and any suitable number of paths 80 and 82 may be associated with a given bank. If desired, all paths 80 and 82 may be grouped together, so there are no individual banks.

The value of the PRSEL signal controls whether circuitry 108 is used to reset or preset the memory elements 62. With one suitable arrangement, shift register 136 is initially filled with ones. Control circuitry 134 shifts a row of zeros into the shift register 136 via data input 142. If the PRSEL signal is high, signal C2 will go low before signal C1 and signal P2 will go high before signal P1, so the memory elements 62 will be reset. If the PRSEL signal is low, signal C1 will go low before signal C2 and signal P1 will go high before signal P2, so the memory elements will be preset.

Consider, as an example, the circuitry associated with the second bank (bank2) when PRSEL is high. Initially, registers 144 and 146 contain ones, so nodes 148 and 150 are high. The high PRSEL signal is applied to the control input of multiplexer 158 via path 156 and is applied to the control input of multiplexer 160 via path 162. Because PRSEL is high, multiplexer 158 routes the high voltage on node 148 to its output as signal C2. Similarly, multiplexer 160 routes the high voltage on node 150 to its output as signal C1. The high signal C2 is inverted by inverter 166 to produce a low inverter power supply signal P2. The high signal C1 is inverted by inverter 164 to produce a low inverter power supply signal P1.

As zeros are shifted through shift register 136, nodes 148 and 150 go low. Because register 144 is positioned upstream from register 146, node 148 goes low before node 150 goes low. As a result, signal P2 goes high before signal P1 goes high. This resets the memory elements in bank2. If PRSEL had been low, multiplexer 158 would have routed the voltage on node 150 to its output as signal C2 and multiplexer 160 would have routed the voltage on node 148 to its output. In this situation, P1 would have gone high after P1 and the memory elements in bank2 would have been preset.

Figure 12:
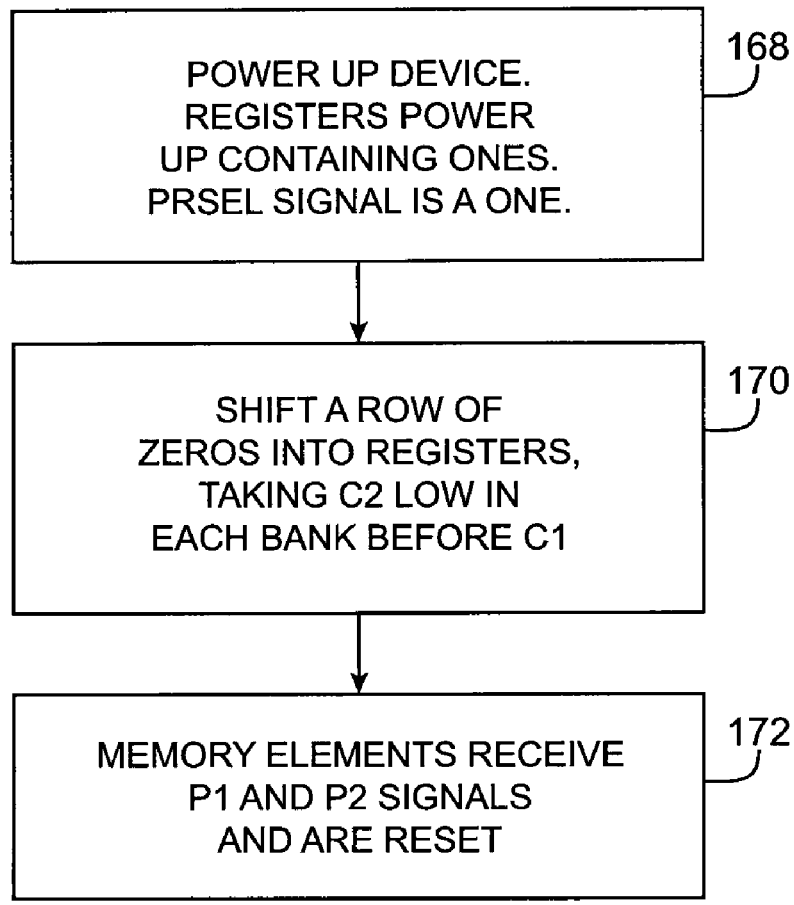
FIG. 12 is a flow chart of illustrative steps involved in resetting an array of programmable logic device memory elements during power-up operations in accordance with the present invention.

Illustrative steps involved in resetting memory elements using the circuitry 108 of FIG. 11 are shown in FIG. 12. In the example of FIG. 12, reset operations are performed as programmable logic device integrated circuit 10 is being powered up. At step 168, device 10 is powered up. During step 168, the registers in the shift register 136 of control circuitry 108 power up to logic ones and control circuitry 134 of FIG. 11 generates a high PRSEL signal for line 138.

At step 170, control circuitry 134 clocks shift register 136 using clock signal CLK on path 140 while loading a row of zeros via data path 142. As the string of zeros are shifted into shift register 136, the signal C2 in each bank goes low before the signal C1 in that bank. As a result, the signal P2 in each bank goes high before the signal P1.

At step 172, the memory elements 62 receive the P1 and P2 signals, the inverters 68 and 70 are powered, and the memory elements are reset.

Figure 13:
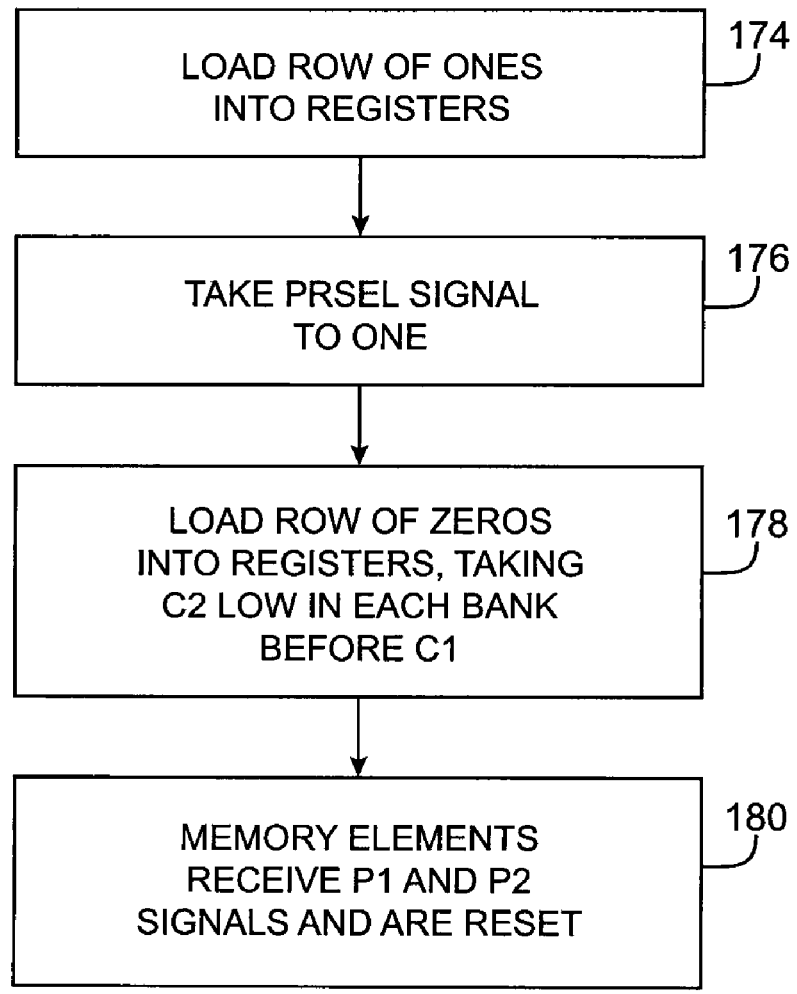
FIG. 13 is a flow chart of illustrative steps involved in resetting an array of programmable logic device memory elements during post-power-up operations in accordance with the present invention.

If desired, memory elements 62 may be reset after power-up operations have been completed. Illustrative steps involved in resetting memory elements 62 using the circuitry 108 of FIG. 11 after device 10 has been powered up are shown in FIG. 13. At step 174, power-up control circuitry 134 loads a series of ones into the registers of shift register 136.

At step 176, control circuitry 134 applies a high PRSEL signal to multiplexers 152 via path 138. Because PRSEL is high, multiplexers 152 connect their "1" inputs to their outputs.

At step 178, control circuitry 134 clocks shift register 136 using clock signal CLK on path 140 while loading a row of zeros into shift via data path 142. As the string of zeros are shifted into shift register 136, the signal C2 in each bank goes low before the signal C1 in that bank, so the signal P2 in each bank goes high before the signal P1.

At step 180, the memory elements 62 receive the P1 and P2 signals, the inverters 68 and 70 are powered, and the memory elements are reset.

Figure 14:
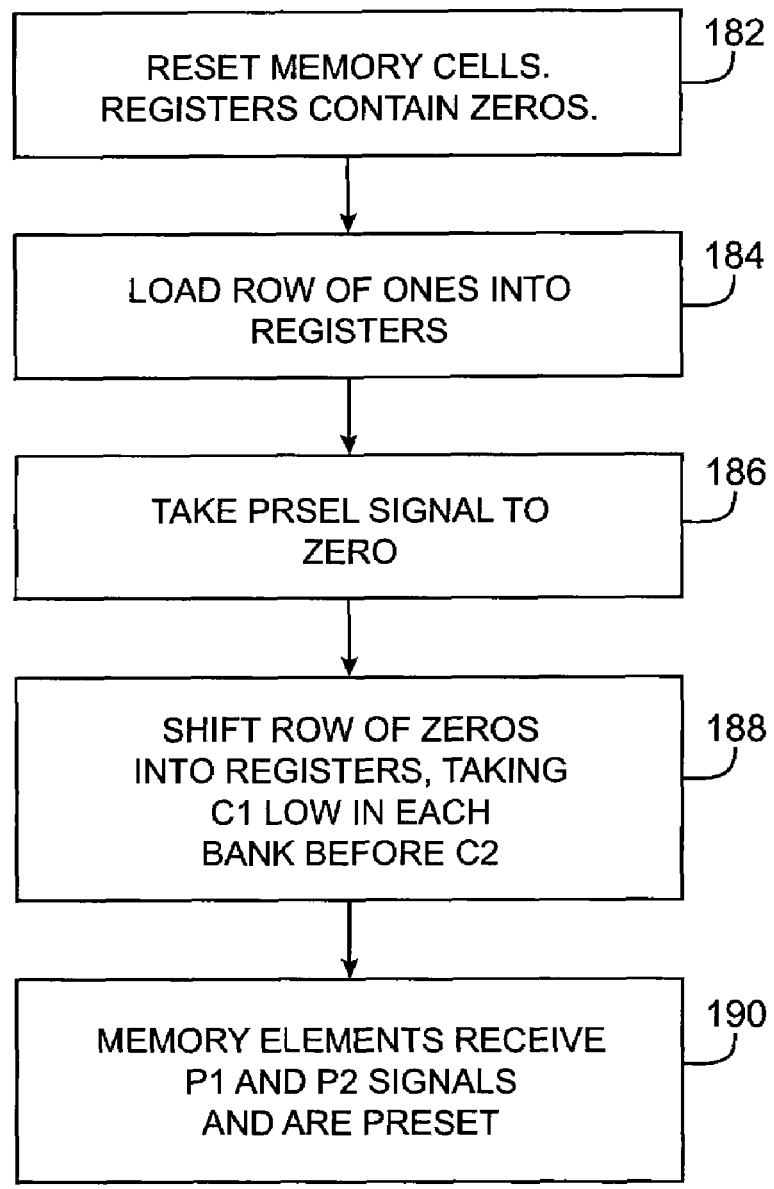
FIG. 14 is a flow chart of illustrative steps involved in resetting an array of programmable logic device memory elements during post-power-up operations in accordance with the present invention.

Illustrative steps involved in presetting memory elements 62 using the circuitry 108 of FIG. 11 after device 10 has been powered up are shown in FIG. 14. At step 182, control circuitry 134 resets the memory cells (e.g., using the steps of FIG. 12 or 13). Following reset operations, the registers of shift register 136 contain zeros.

At step 184, control circuitry 134 loads a series of ones into the registers of shift register 136.

At step 186, control circuitry 134 applies a low (zero) PRSEL signal to multiplexers 152 via path 138. Because PRSEL is low, multiplexers 152 connect their "0" inputs to their outputs.

At step 188, control circuitry 134 clocks shift register 136 using clock signal CLK on path 140 while loading a row of zeros into shift via data path 142. As the string of zeros are shifted into shift register 136, the signal C1 in each bank goes low before the signal C2 in that bank, so the signal P1 in each bank goes high before the signal P2.

At step 190, the memory elements 62 receive the P1 and P2 signals, the inverters 68 and 70 are powered, and the memory elements are preset.

In general, any suitable architecture may be used for routing the inverter power supply signals P1 and P2 to the memory elements 62 of memory array 98. In the example of FIG. 11, inverter power supply paths 80 and 82 are arranged in banks and run vertically. Each bank contains multiple pairs of P1 and P2 paths and can be preset and reset individually. Powering up banks of memory elements 62 individually may be desirable to avoid unnecessarily placing large peak current requirements on power supply circuitry on device 10.

Figure 15:
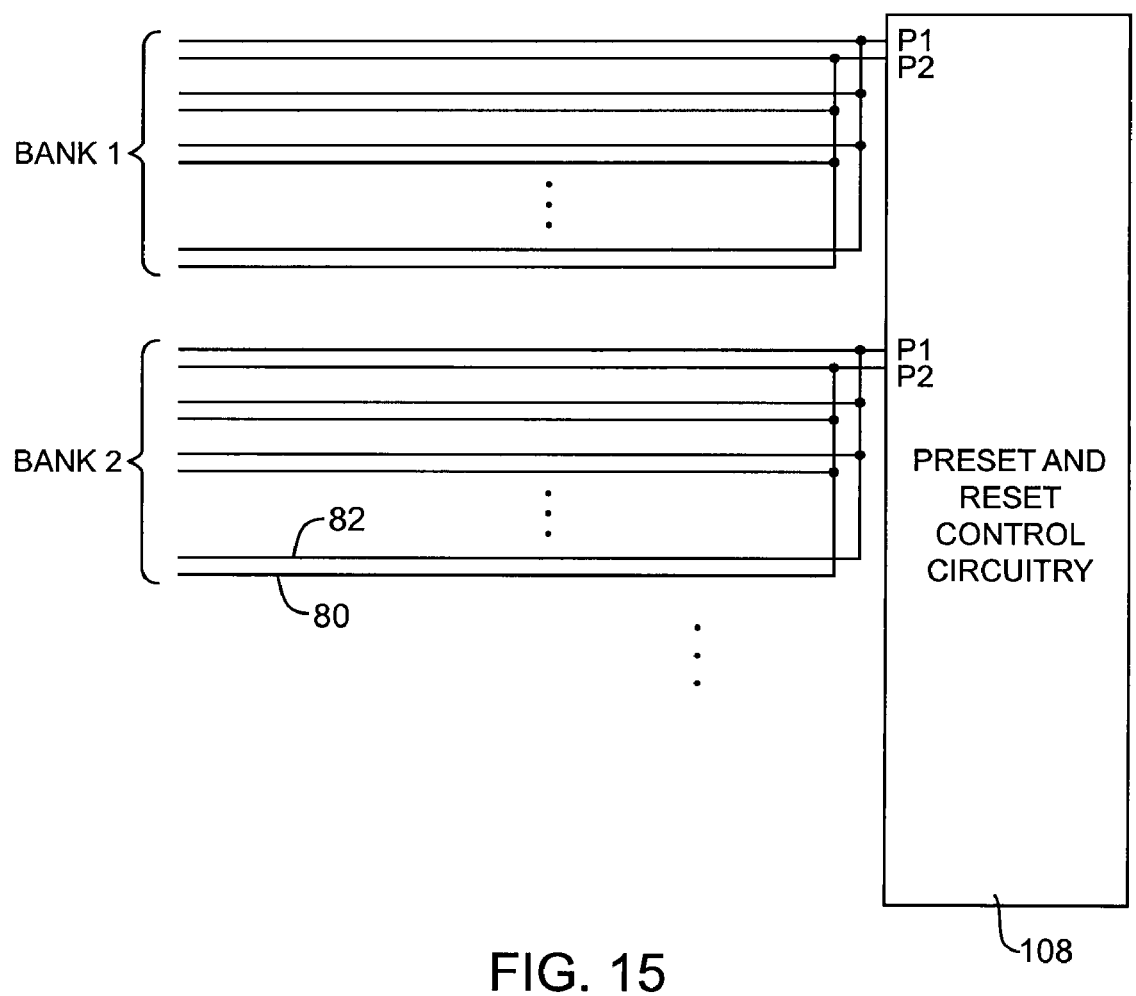
FIG. 15 is a diagram showing memory element inverter power supply lines that are arranged in a set of horizontal banks in accordance with the present invention.

Another suitable arrangement is shown in FIG. 15. In the example of FIG. 15, lines 80 and 82 are arranged in banks and run horizontally. Each bank in FIG. 15 contains multiple pairs of inverter power supply lines and can be controlled individually.

Figure 16:
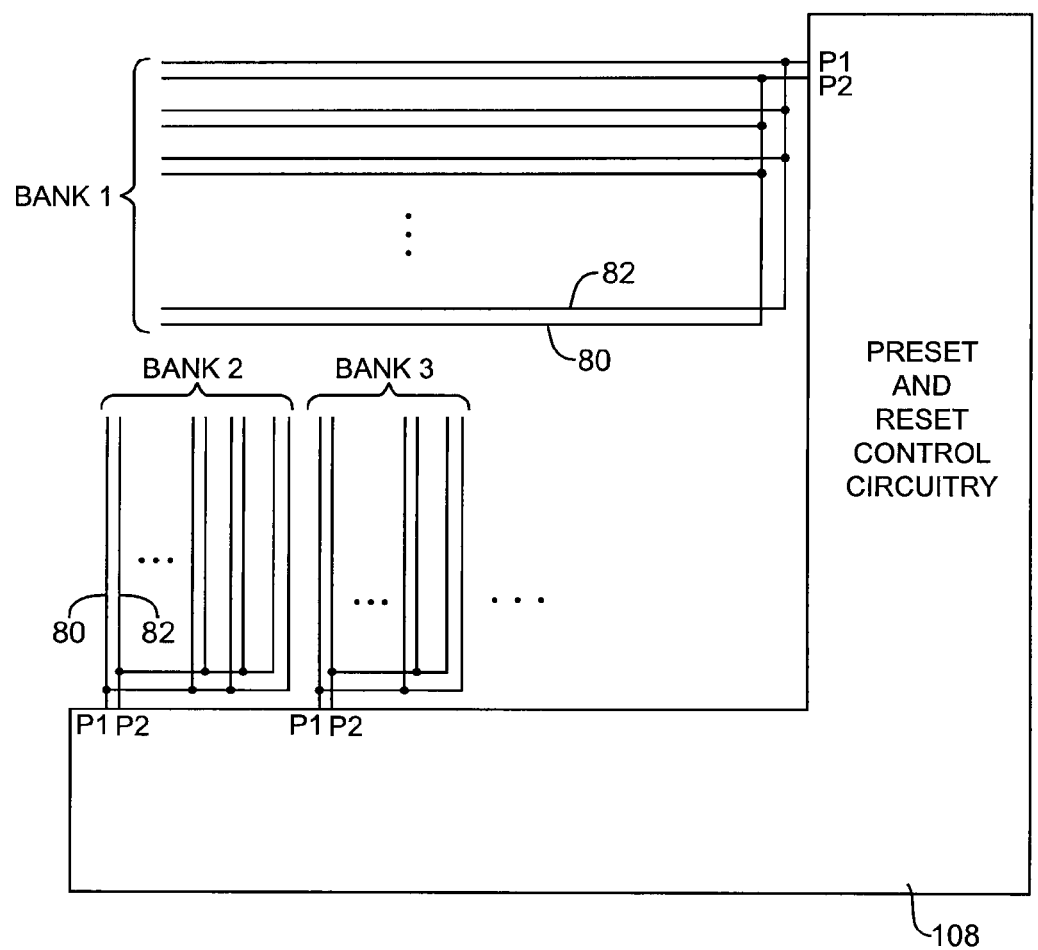
FIG. 16 is a diagram showing memory element inverter power supply lines that are arranged in a hybrid pattern including both horizontal and vertical sets of lines in accordance with the present invention.

FIG. 16 illustrates a hybrid architecture. With this type of approach, pairs of inverter power supply lines 80 and 82 are arranged in both horizontal banks such as bank 1 and vertical banks such as bank 2 and bank3. In general, there may be any suitable number of vertical banks and any suitable number of horizontal banks on a device 10.

Figure 17:
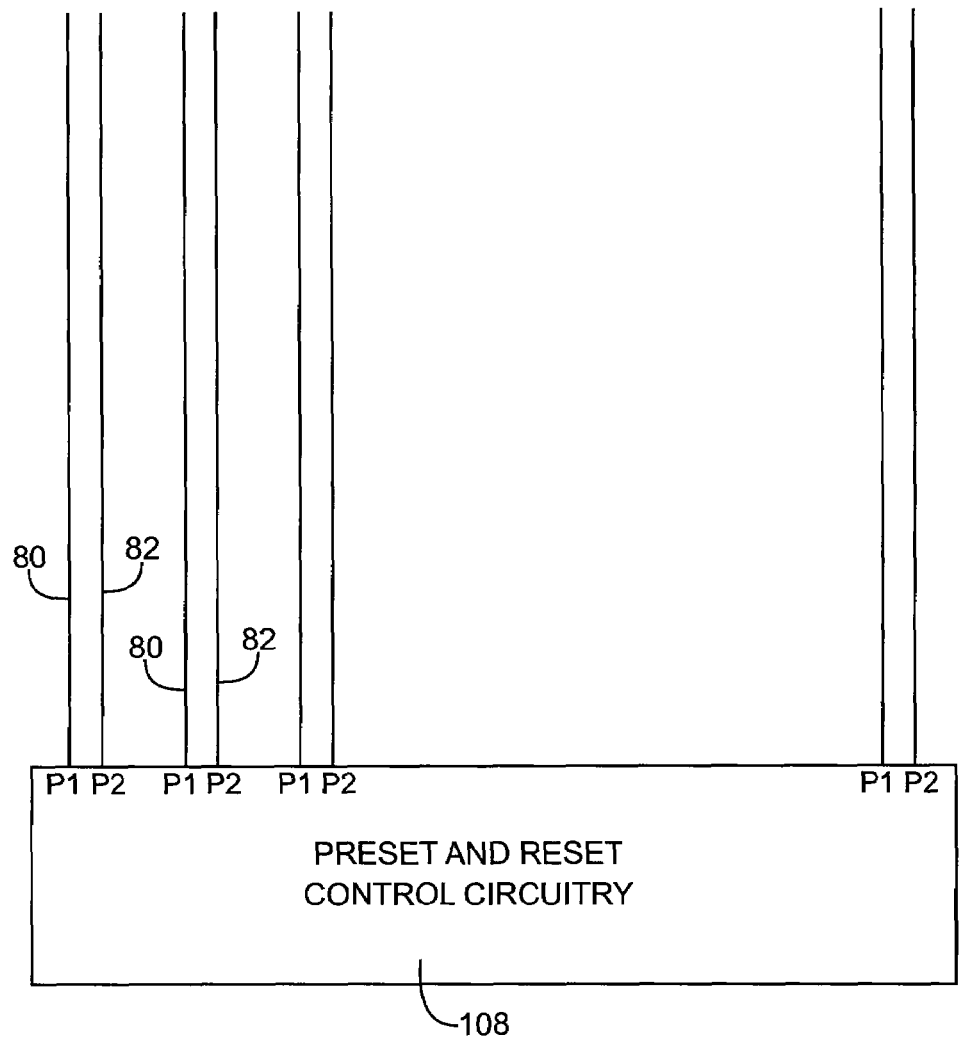
FIG. 17 is a diagram showing memory element inverter power supply lines that are arranged in a pattern of individually addressable pairs in accordance with the present invention.

If desired, preset and reset control circuitry 108 can distribute inverter power supply signals P1 and P2 on numerous individually-controllable pairs of inverter power supply lines 80 and 82 without using banks, as shown in FIG. 17. Because groups of paths 80 and 82 are not connected in parallel to form banks, the architecture of FIG. 17 offers a high degree of granularity. However, more registers are required in the shift register for preset and reset control circuitry 108 in the FIG. 17 arrangement than in arrangements in which memory elements 62 and inverter power supply lines are organized in banks.

Figure 18:
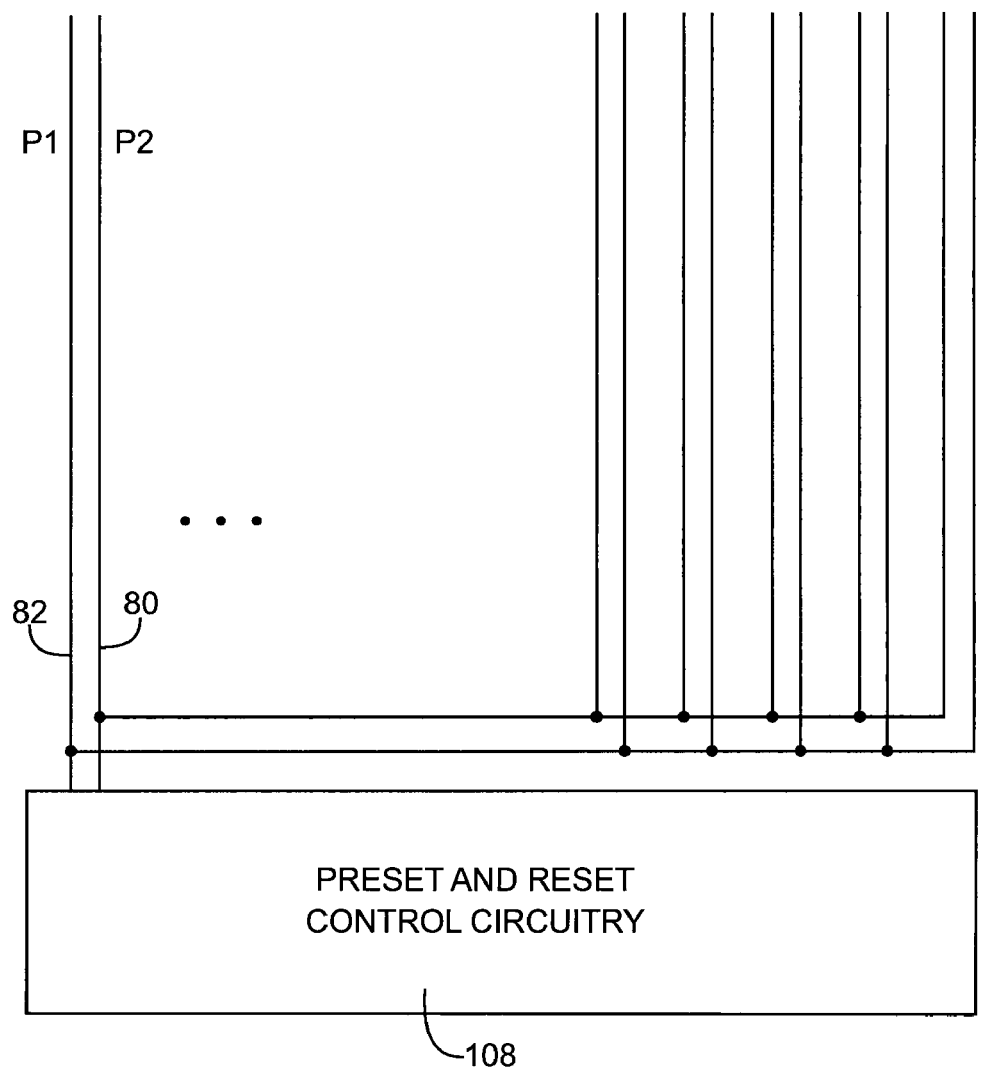
FIG. 18 is a diagram showing memory element inverter power supply lines that are arranged in a single bank in accordance with the present invention.

Another suitable architecture that may be used is shown in FIG. 18. In the FIG. 18 example, there is only a single bank associated with the entire array 98 of memory elements 62. This type of arrangement helps to lower the complexity of the preset and reset control circuitry, but can lead to larger peak currents during preset and reset operations.

As described in connection with FIG. 9, it may be desirable to use an elevated power supply voltage (i.e., a power supply voltage that is larger than the core logic power supply voltage used to power the circuitry of programmable logic 18) in powering the inverters 68 and 70. When an elevated power supply voltage is used, the output signal DATAOUT that is produced from memory elements 62 that have been loaded with logic ones is relative large (e.g., 1.6 volts), which improves performance by fully turning on associated NMOS pass transistors that are controlled by the signal DATAOUT.

Figure 19:
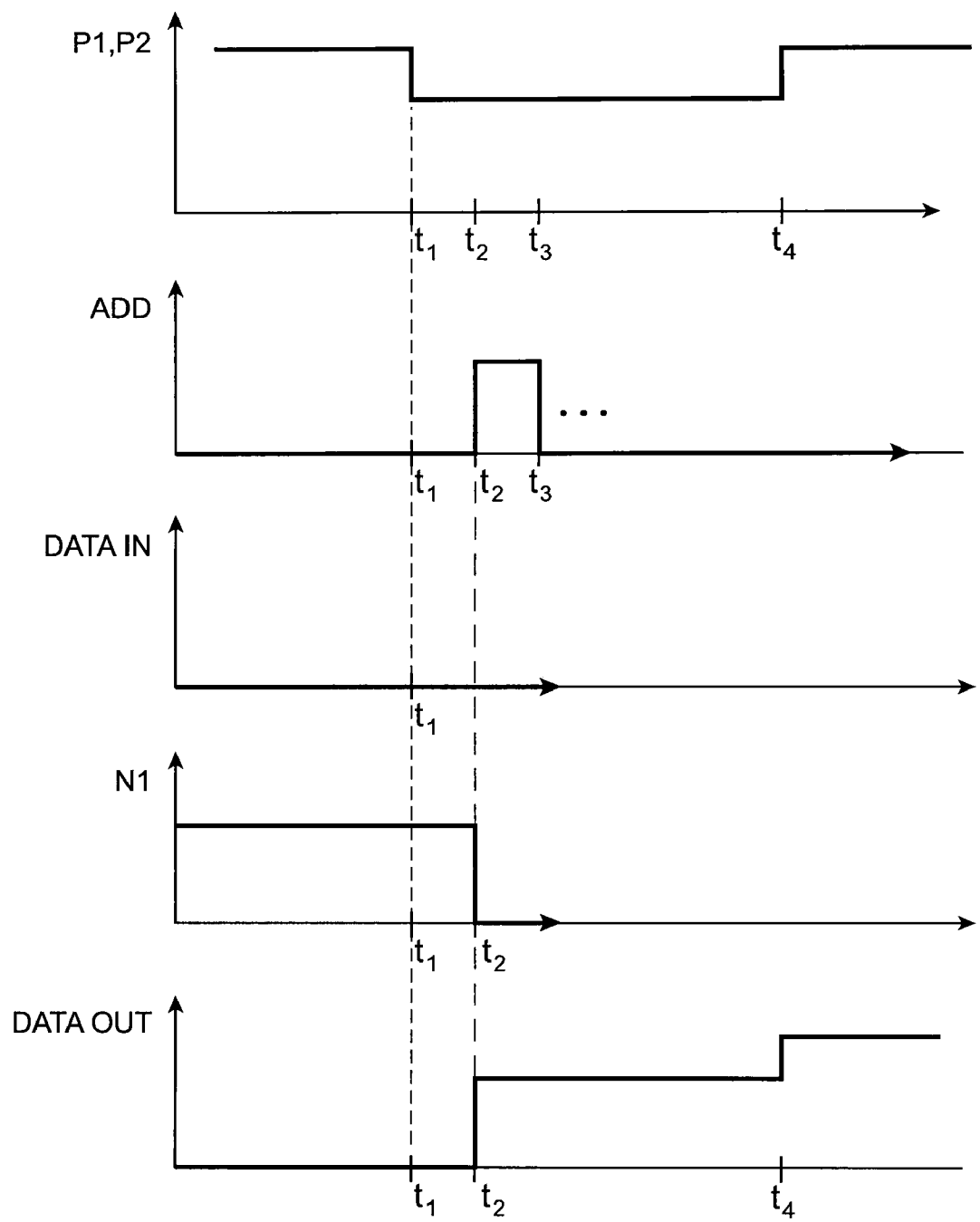
FIG. 19 is a diagram showing signals involved in loading data into a memory element in a programmable logic device integrated circuit in accordance with the present invention.

If an elevated power supply level is used, the elevated power supply level can be momentarily reduced when it is desired to load configuration data into array 98. An example of loading data into a memory element 62 in a programmable logic device integrated circuit 10 that uses elevated P1 and P2 power supply signals is shown in FIG. 19. As shown in FIG. 19, at times before $t_1$, P1 and P2 are relatively large (e.g., 1.6 volts). Prior to data loading, the power supply control circuit 106 of FIG. 9 can lower the value of Vcc that is supplied to preset and reset control circuitry 108. The lowered value of Vcc is applied to inverters 154 (FIG. 11), so the corresponding value of P1 and P2 are lowered at time $t_1$, as shown in FIG. 19. As an example, P1 and P2 may be lowered to 1.1 volts.

With P1 and P2 in their lowered state, address signals ADD can be systematically asserted to address and load data into memory element 62. An illustrative asserted ADD signal is shown as the pulse ADD between time $t_2$ and $t_3$ in the second trace of FIG. 19. When ADD is asserted, the value of DATAIN on line 96 (FIG. 5) is driven onto node N1. In the example of FIG. 19, a logic one is being loaded into the memory element, so DATAIN is low. At times $t_2$, ADD goes high, turning on address transistor 94 and driving a zero onto node N1. Inverter 68 inverts the low signal N1, so that DATAOUT is high (e.g., 1.1 volts). After all of the configuration data has been loaded, the power supply control circuit 106 can take Vcc to its normal, elevated value of 1.6 volts. As a result, the P1 and P2 inverter power supply signals rise from 1.1 to 1.6 volts at time $t_4$. Because P1 and P2 have been elevated at time $t_4$, the DATAOUT signal is also elevated at time $t_4$, as shown in the last trace of FIG. 19.

Power-down circuitry can be used to selectively inactivate portions of memory element array 98 that are not needed to implement a given custom logic design. Powering down unused memory elements 62 in this way helps to lower power consumption on programmable logic device integrated circuit 10. In general, any suitable power-down circuitry may be used with device 10. One illustrative arrangement is shown in FIG. 20.

Figure 20:
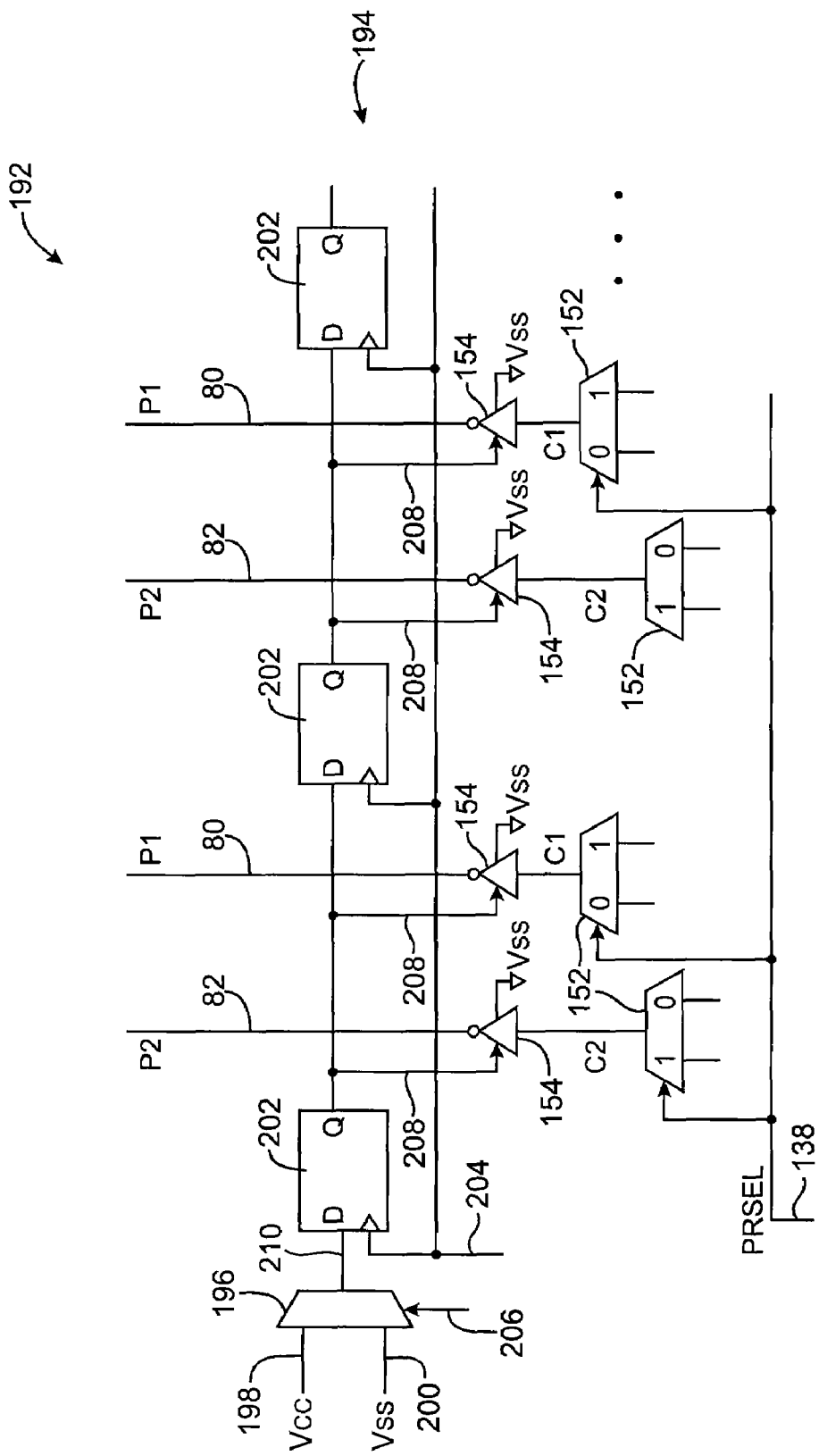
FIG. 20 is a circuit diagram of illustrative power-down circuitry that may be used to selectively power down portions of a memory array of the type shown in FIG. 9 in accordance with the present invention.

The illustrative power-down circuitry 192 of FIG. 20 has a power-down shift register 194. Shift register 194 contains registers 202. The output of each register 202 provides a voltage (Vcc or Vss) to the positive power supply input of a corresponding inverter 154 over a respective path 208. Each inverter 154 also is powered using a ground voltage Vss. The voltage on each path 208 is controlled by the contents of the associated register 202. If a given register 202 contains a zero, the voltage at its output and on its path 208 will be Vss and its associated inverter 154 will be disabled. If a given register contains a one, the voltage at its output and on its path 208 will be Vcc and its associated inverter 154 will be enabled.

As described in connection with FIG. 11, the inverters (when enabled) invert signals C1 and C2 to produce corresponding inverter power supply signals P1 and P2. Signals P1 and P2 may be distributed on individual pairs of inverter power distribution paths 80 and 82 or on banks of paths 80 and 82.

Power down shift register 194 may be loaded with a pattern of ones and zeros to selectively power down portions of memory array 98. The data input 210 of shift register 194 is connected to the output of a multiplexer 196. Input 198 of multiplexer 196 is connected to Vcc. Input 200 is connected to Vss. The state of multiplexer 196 is controlled by a control signal on line 206 that is generated by control circuitry 108 (FIG. 9). Based on this control signal, multiplexer 196 either connects input 198 or input 200 to output 210. Control circuitry 108 also generates clock signals that are applied to shift register 194 via clock input 204. As clock signals are received by shift register 194, data is shifted into shift register 194 through multiplexer 196. When input 198 is connected to output 210, ones are shifted into register 194. When input 200 is connected to output 210, zeros are shifted into register 194.

Figure 21:
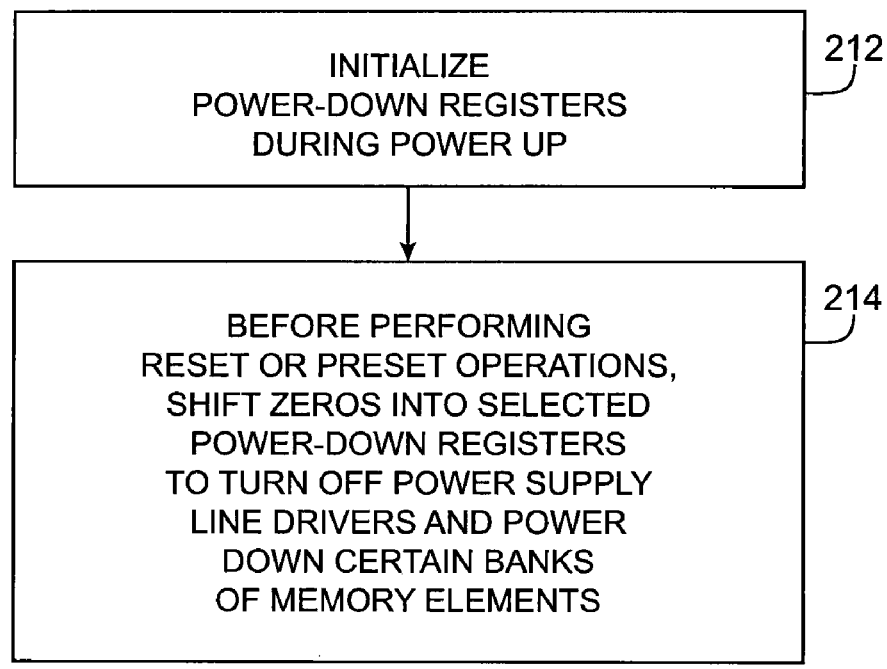
FIG. 21 is a flow chart of illustrative steps involved in powering down a portion of a memory element array in accordance with the present invention.

Illustrative steps involved in powering down portions of memory array 98 using power-down circuitry of the type shown in FIG. 20 are shown in FIG. 21. At step 212, device 10 is powered up and, during power-up operations, the power-down registers 202 are initialized. The registers 202 can be powered up as ones or as zeros. If the registers 202 are powered up as zeros, ones can be shifted into the registers 202 during the initialization operations of step 212.

At step 214, control circuitry 108 shifts zeros into some or all of the registers 202 of shift register 194. Zeros are shifted into register 194 by selectively connecting multiplexer input 200 to output 210 (FIG. 20). The operations of step 214 are preferably performed before performing reset or preset operations of the type described in connection with FIGS. 6, 7, and 8. As an example, the operations of step 214 may be performed between times $t_{pd1}$ and $t_{pd2}$, as shown in FIG. 6. If registers 202 powered up as zeros, the ones that are shifted into registers 202 during step 212 can be shifted into registers 202 between times $t_{pd1}$ and $t_{pd2}$ before the desired pattern of power-down bits is loaded at step 214.

After the desired pattern of zeros has been loaded into registers 202, a pattern of low and high voltage output signals are produced on corresponding lines 208. This selectively turns on and off various inverters 154. If a pair of inverters 154 is turned off, the signals P1 and P2 one the lines 80 and 82 that are driven by those inverters will not be powered and the associated bank of memory elements will not be powered.

The foregoing is merely illustrative of the principles of this invention and various modifications can be made by those skilled in the art without departing from the scope and spirit of the invention.

What is claimed is:

1. An integrated circuit comprising:
    a plurality of memory elements, each having first and second independently-powered cross-coupled inverters, wherein the first inverter in each memory element has a first positive power supply terminal and wherein the second inverter in each memory element has a second positive power supply terminal;
    a first inverter power supply path that is connected to the first positive power supply terminal of each memory element;
    a second inverter power supply path that is connected to the second positive power supply terminal of each memory element; and
    control circuitry that resets the memory elements by applying power to the second inverter power supply path before applying power to the first inverter power supply path.

2. The integrated circuit defined in claim 1 further comprising multiple banks of the memory elements each of which has independently-controlled first and second inverter power supply paths.

3. The integrated circuit defined in claim 1 further comprising:
    multiple banks of the memory elements each of which has independently-controlled first and second inverter power supply paths; and
    multiple pairs of multiplexers having outputs, wherein the outputs of each of the pairs of multiplexers provide signals that are routed to the first and second inverter power supply paths in a respective bank.

4. The integrated circuit defined in claim 1 further comprising:
    multiple banks of the memory elements each of which has independently-controlled first and second inverter power supply paths;
    multiple pairs of inverters; and
    multiple pairs of multiplexers having outputs, wherein the outputs of each pair of multiplexers provide signals that are routed through a respective one of the pairs of inverters to the first and second inverter power supply paths in a respective bank.

5. The integrated circuit defined in claim 1 further comprising:
    multiple banks of the memory elements each of which has independently-controlled first and second inverter power supply paths;
    multiple pairs of inverters;
    multiple pairs of multiplexers having outputs, wherein the outputs of each pair of multiplexers provide signals that are routed through a respective one of the pairs of inverters to the first and second inverter power supply paths in a respective bank; and a power-down shift register that supplies control signals to each of the pairs of inverters to selectively disable some of the pairs of inverters and power down associated banks of memory elements.

6. The integrated circuit defined in claim 1, wherein core logic on the integrated circuit is powered at a core logic positive power supply voltage and wherein the control circuitry further comprises:
a voltage regulator that generates an elevated power supply voltage that is elevated with respect to the core logic power supply voltage; and
preset and reset control circuitry that applies the elevated power supply voltage to the first and second inverter power supply paths.

7. The integrated circuit defined in claim 1 wherein the memory elements are loaded with configuration data, the integrated circuit further comprising programmable logic including a plurality of pass transistors, wherein each pass transistor has an input that receives a control signal from a respective one of the memory elements.

8. The integrated circuit defined in claim 1 wherein the control circuitry comprises multiplexers that are controlled so that the control circuitry presets the memory elements by applying power to the first inverter power supply path before applying power to the second inverter power supply path.

9. An integrated circuit comprising:
a memory element formed from independently-powered first and second cross-coupled inverters, wherein the first and second inverters each have an input and an output;
a data input line;
an address transistor in the memory element that is connected between the data input line and the input of the first inverter;
a data output line connected to the output of the first inverter in the memory element; and
circuitry that applies power to the first and second inverters, wherein when power is applied to the second inverter before the first inverter the memory element is reset and the data output line has a logic zero value and wherein when power is applied to the first inverter before the second inverter, the memory element is preset and the data output line has a logic one value.

10. The integrated circuit defined in claim 9 further comprising a plurality of the memory elements each having first and second independently-powered cross-coupled inverters, wherein the circuitry comprises:
a shift register formed from a plurality of registers, each register in the shift register supplying an output signal to a respective node;
multiplexers that have inputs connected to pairs of adjacent nodes in the shift register and that have outputs; and
inverters connected to the outputs of the multiplexers, wherein the inverters are organized in pairs of first and second inverters, wherein the memory elements are organized in banks of memory elements, wherein the first inverter in each pair supplies power to the first inverters in a corresponding bank of memory elements, and wherein the second inverter in each pair supplies power to the second inverters in that bank of memory elements.

11. The integrated circuit defined in claim 9 further comprising:
a plurality of the memory elements each having first and second independently-powered cross-coupled inverters, wherein the circuitry comprises:
a shift register formed from a plurality of registers, each register in the shift register supplying an output signal to a respective node;
multiplexers that have inputs connected to pairs of adjacent nodes in the shift register and that have outputs; and
inverters connected to the outputs of the multiplexers, wherein each inverter has a positive power supply input, wherein the inverters are organized in pairs of first and second inverters, wherein the memory elements are organized in banks of memory elements, wherein the first inverter in each pair supplies power to the first inverters in a corresponding bank of memory elements, and wherein the second inverter in each pair supplies power to the second inverters in that bank of memory elements; and
power-down circuitry that applies a positive voltage to the positive power supply inputs of a first set of the pairs of inverters to enable the first set of the pairs of inverters and that applies a ground voltage to the positive power supply inputs of a second set of the pairs of inverters to disable the second set of the pairs of inverters.

12. The integrated circuit defined in claim 9 further comprising:
a plurality of the memory elements each having first and second independently-powered cross-coupled inverters, wherein the circuitry comprises:
a shift register formed from a plurality of registers, each register in the shift register supplying an output signal to a respective node;
multiplexers that have inputs connected to pairs of adjacent nodes in the shift register and that have outputs; and
inverters connected to the outputs of the multiplexers, wherein each inverter has a positive power supply input, wherein the inverters are organized in pairs of first and second inverters, wherein the memory elements are organized in banks of memory elements, wherein the first inverter in each pair supplies power to the first inverters in a corresponding bank of memory elements, and wherein the second inverter in each pair supplies power to the second inverters in that bank of memory elements; and
power-down circuitry that applies a positive voltage to the positive power supply inputs of a first set of the pairs of inverters to enable the first set of the pairs of inverters and that applies a ground voltage to the positive power supply inputs of a second set of the pairs of inverters to disable the second set of the pairs of the inverters, wherein the power-down circuitry includes a power-down shift register.

13. The integrated circuit defined in claim 9 further comprising:
a plurality of the memory elements each having first and second independently-powered cross-coupled inverters, wherein the circuitry comprises:
a shift register formed from a plurality of registers, each register in the shift register supplying an output signal to a respective node;
multiplexers that have inputs connected to pairs of adjacent nodes in the shift register, that have outputs, and that have control inputs;
inverters connected to the outputs of the multiplexers, wherein each inverter has a positive power supply input, wherein the inverters are organized in pairs of first and second inverters, wherein the memory elements are organized in banks of memory elements, wherein the first inverter in each pair supplies power to the first inverters in a corresponding bank of memory elements, and wherein the second inverter in each pair supplies power to the second inverters in that bank of memory elements;

power-up control circuitry that supplies a control signal to the control inputs of the multiplexers, wherein when the control signal has a first value, power is applied to the second inverters before the first inverters as zeros are shifted into the shift register to reset the memory elements and wherein when the control signal has a second value, power is applied to the first inverters before the second inverters as zeros are shifted into the shift register to preset the memory elements; and power-down circuitry that applies a positive voltage to the positive power supply inputs of a first set of the pairs of inverters to enable the first set of the pairs of inverters and that applies a ground voltage to the positive power supply inputs of a second set of the pairs of inverters to disable the second set of pairs of inverters.

14. A method of resetting a plurality of memory elements in a memory array on an integrated circuit, wherein each memory element has first and second independently-powered cross-coupled inverters, wherein the first inverter in each memory element has a first positive power supply terminal and wherein the second inverter in each memory element has a second positive power supply terminal, wherein a first inverter power supply path is connected to the first positive power supply terminal of each memory element in the plurality of memory elements, and wherein a second inverter power supply path is connected to the second positive power supply terminal of each memory element in the plurality of memory elements, the method comprising:

using control circuitry on the integrated circuit to apply a positive power supply voltage to the second inverter power supply path to power the second inverter in the plurality of memory elements while the first inverter power supply path in the plurality of memory elements is at a ground voltage; and after applying the positive power supply voltage to the second inverter power supply path in the plurality of memory elements, using the control circuitry to apply the positive power supply voltage to the first inverter power supply path in the plurality of memory elements to power the first inverter in each of the plurality of memory elements to reset the plurality of memory elements.

15. The method defined in claim 14 wherein the memory elements of the array are arranged in banks each of which has an associated first inverter power supply path for applying the positive power supply voltage to the first positive power supply terminals of its first inverters and an associated second inverter power supply path for applying the positive power supply voltage to the second positive power supply terminals of its second inverters, the method further comprising:

using a power-down shift register to selectively pass the positive power supply voltage to the first and second inverter power supply paths of some of the banks while blocking the positive power supply voltage from the first and second inverter power supply paths in other banks.

16. The method defined in claim 14 wherein the memory elements of the array are arranged in banks each of which has an associated first inverter power supply path for applying the positive power supply voltage to the first positive power supply terminals of its first inverters and an associated second inverter power supply path for applying the positive power supply voltage to the second positive power supply terminals of its second inverters, the method further comprising:

powering each bank of memory elements in sequence using a shift register, wherein powering each bank comprises applying the positive power supply voltage to the second inverter power supply path in that bank after applying the positive power supply voltage to the first inverter power supply path in that bank.

17. The method defined in claim 14 further comprising:

when it is desired to preset the plurality of memory elements, using the control circuitry to apply the positive power supply voltage to the first inverter power supply path to power the first inverters in the plurality of memory elements while the second inverter power supply path in the plurality of memory elements is at a ground voltage; and after applying the positive power supply voltage to the first inverter power supply path in the plurality of memory elements, using the control circuitry to apply the positive power supply voltage to the second inverter power supply path in the plurality of memory elements to power the second inverter in the plurality of memory elements to preset the plurality of memory elements.

18. The method defined in claim 14 further comprising:

placing multiplexers that are connected to a shift register in a first state to reset the plurality of memory elements or a second state to preset the plurality of memory elements; and shifting zeros into the shift register in place of ones, so that when the multiplexers have been placed in the first state, the plurality of memory elements are reset and when the multiplexers have been placed in the second state, the plurality of memory elements are preset.

19. The method defined in claim 14 further comprising:

placing multiplexers that are connected to a shift register in a first state to reset the plurality of memory elements or a second state to preset the plurality of memory elements, wherein each multiplexer has two inputs connected to adjacent data register outputs in the shift register, wherein each multiplexer has an output connected to an inverter, wherein the inverters to which the multiplexers are connected are arranged in pairs of first and second inverters, wherein the memory elements are arranged in banks respectively associated with the pairs of inverters, wherein the first inverter in each pair of inverters provides the positive power supply voltage to the first inverter power supply path in its associated bank, and wherein the second inverter in each pair provides the positive power supply voltage to the second inverter power supply path in its associated bank; and shifting zeros into the shift register in place of ones, so that when the multiplexers have been placed in the first state, the banks of memory elements are reset and when the multiplexers have been placed in the second state, the banks of memory elements are preset.

20. The method defined in claim 14 further comprising:

placing multiplexers that are connected to a shift register in a first state to reset the plurality of memory elements or a second state to preset the plurality of memory elements, wherein each multiplexer has two inputs connected to adjacent data register outputs in the shift register, wherein each multiplexer has an output connected to an inverter, wherein the inverters are arranged in pairs of first and second inverters, wherein the memory elements are arranged in banks associated with the pairs of inverters, wherein the first inverter in each pair of inverters provides the positive power supply voltage to the first inverter power supply path in its associated bank, and wherein the second inverter in each pair provides the positive power supply voltage to the second inverter power supply path in its associated bank; and shifting zeros into the shift register in place of ones, so that when the multiplexers have been placed in the first state, the output of the second inverter in the pair of inverters of each bank goes high before the output of the first inverter in that pair of inverters goes high and the memory elements in that bank are reset, and when the multiplexers have been placed in the second state, the output of the first inverter in the pair of inverters of each bank goes high before the output of the second inverter in that pair of inverters goes high and the memory elements in that bank are preset.

* * * * *